(12) United States Patent
    Martino

(10) Patent No.: US 9,978,832 B1
(45) Date of Patent: May 22, 2018

(54) WIDE BANDGAP SEMICONDUCTOR DEVICE WITH VERTICAL SUPERJUNCTION EDGE TERMINATION FOR THE DRIFT REGION

(71) Applicant: The United States of America, as represented by the Secretary of the Navy, Washington, DC (US)

(72) Inventor: Christopher Adrian Martino, Arnold, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days. days.

(21) Appl. No.: 15/684,359

(22) Filed: Aug. 23, 2017

Related U.S. Application Data

(60) Provisional application No. 62/452,827, filed on Jan. 31, 2017.

(51) Int. Cl.
    *H01L 29/06* (2006.01)
    *H01L 29/16* (2006.01)
    *H01L 21/04* (2006.01)

(52) U.S. Cl.
    CPC ........ *H01L 29/0634* (2013.01); *H01L 21/046* (2013.01); *H01L 21/0475* (2013.01); *H01L 29/1608* (2013.01)

(58) Field of Classification Search
    CPC .................................................. H01L 29/0634
    USPC ............................................ 257/77; 438/141
    See application file for complete search history.

(56) References Cited

U.S. PATENT DOCUMENTS

| | | | |
|---|---|---|---|
| 6,621,122 B2 | 9/2003 | Qu | |
| 7,655,981 B2 | 2/2010 | Lee | |
| 7,859,076 B2 | 12/2010 | Van Dalen et al. | |
| 8,653,586 B2 | 2/2014 | Xiao | |
| 9,082,845 B1* | 7/2015 | Seok | H01L 29/7811 |
| 9,184,277 B2* | 11/2015 | Willmeroth | H01L 29/7802 |
| 9,263,515 B2 | 2/2016 | Qu et al. | |
| 9,773,863 B2* | 9/2017 | Hirler | H01L 29/0634 |
| 9,859,360 B2* | 1/2018 | Antoniou | H01L 29/0619 |
| 2007/0228462 A1* | 10/2007 | Saito | H01L 29/0634 257/341 |
| 2007/0272977 A1* | 11/2007 | Saito | H01L 29/0634 257/329 |
| 2009/0032851 A1* | 2/2009 | Pfirsch | H01L 21/221 257/288 |
| 2009/0212301 A1 | 8/2009 | Zhang et al. | |

(Continued)

OTHER PUBLICATIONS

Deboy, G., N. Marz, J. P. Stengl, H. Stack, J. Tihanyi and H. Weber, "A new generation of high voltage MOSFETs breaks the limit line of silicon," International Electron Devices Meeting 1998. Technical Digest (Cat. No. 98CH36217), San Francisco, CA, USA, 1998, pp. 683-685.

(Continued)

*Primary Examiner* — George Fourson, III
(74) *Attorney, Agent, or Firm* — Naval Postgraduate School; Lisa Norris

(57) ABSTRACT

A vertical superjunction edge termination structure for the drift region of wide bandgap semiconductor devices that provides a low resistance and high off voltage allowing the breakdown voltage of the superjunction drift region to be raised.

22 Claims, 45 Drawing Sheets
(41 of 45 Drawing Sheet(s) Filed in Color)

(56) References Cited

U.S. PATENT DOCUMENTS

| | | | | |
|---|---|---|---|---|
| 2012/0112306 A1* | 5/2012 | Onishi | ................ | H01L 29/0634 |
| | | | | 257/487 |
| 2013/0140633 A1* | 6/2013 | Pattanayak | ........... | H01L 21/266 |
| | | | | 257/341 |
| 2015/0162410 A1* | 6/2015 | Padmanabhan | ....... | H01L 29/407 |
| | | | | 257/488 |
| 2015/0303294 A1* | 10/2015 | Sakata | ................ | H01L 29/4238 |
| | | | | 257/330 |
| 2015/0333118 A1* | 11/2015 | Eguchi | .............. | H01L 29/66477 |
| | | | | 257/493 |
| 2018/0047722 A1* | 2/2018 | Nishimura | .......... | H01L 27/0629 |

OTHER PUBLICATIONS

Li, Z., H. Naik and T. P. Chow, "Design of GaN and SiC 5-20kV vertical superjunction structures," 2012 Lester Eastman Conference on High Performance Devices (LEC), Singapore, 2012, pp. 1-4.

Soler, Victor, M. Berthou, A. Mihaila, J. Monserat, P. Godignon, J. Rebollo, and J. Millan, "Planar edge terminations for high voltage 4H-SiC power MOSFETs," Semiconductor Science and Technology, vol. 32 (2017), pp. 1-7.

\* cited by examiner

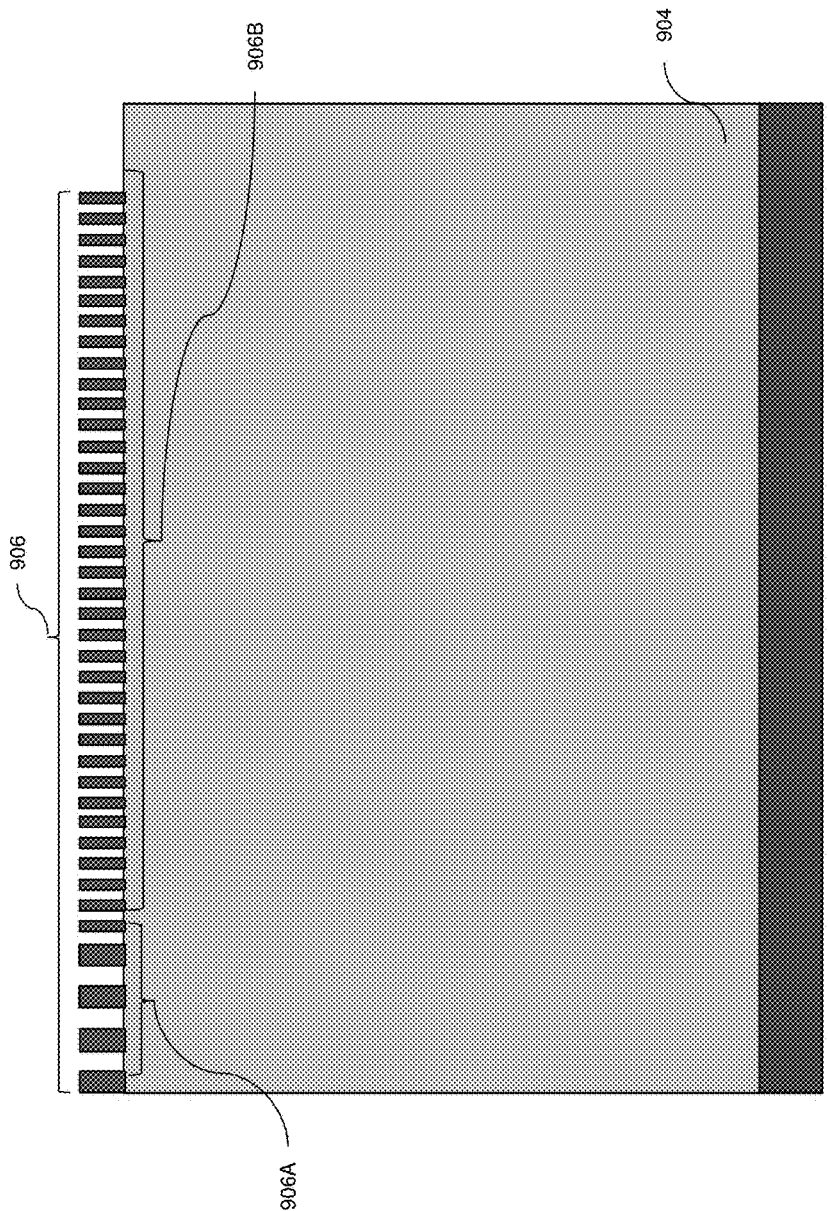

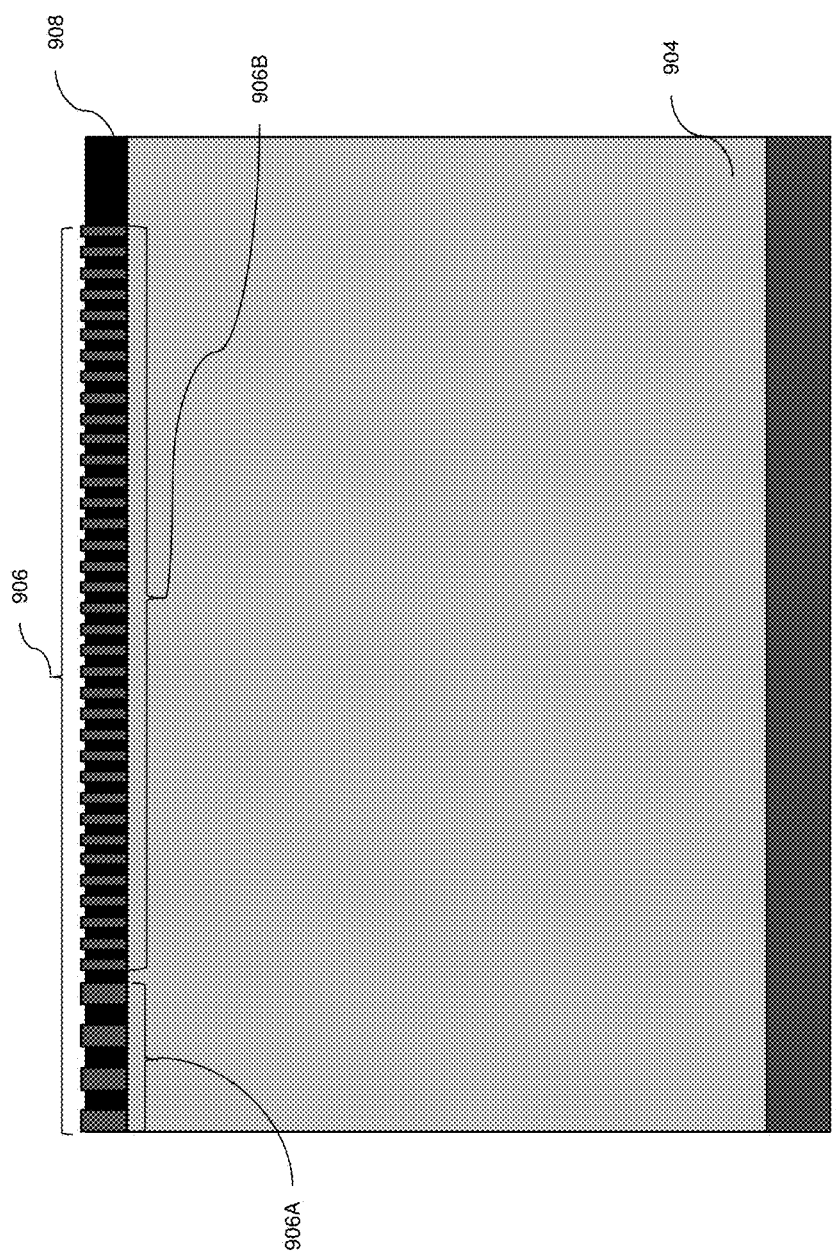

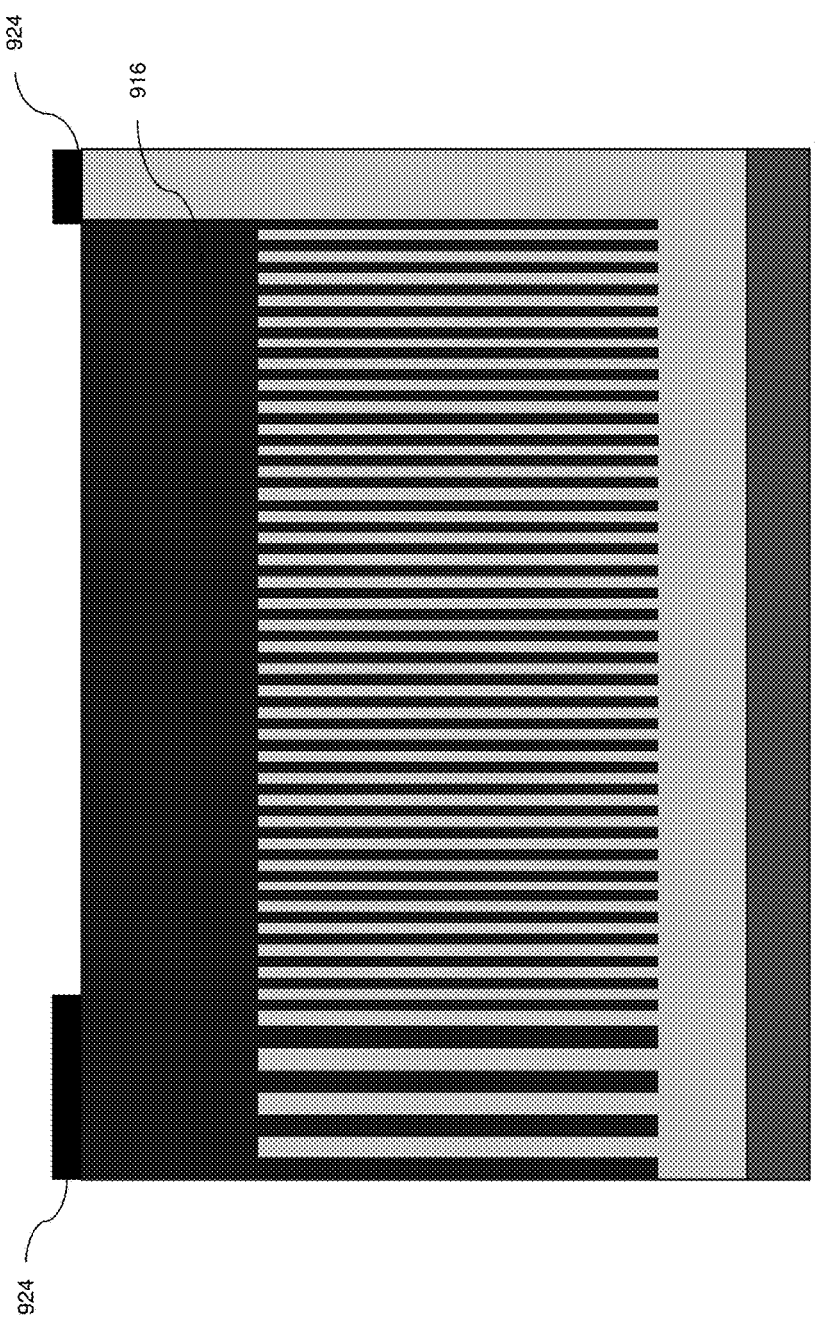

WIDE BANDGAP SEMICONDUCTOR DEVICE WITH VERTICAL SUPERJUNCTION EDGE TERMINATION FOR THE DRIFT REGION

CROSS-REFERENCE TO RELATED APPLICATIONS

This application claims the benefit of U.S. Provisional Application Ser. No. 62/452,827, filed Jan. 31, 2017, which is hereby incorporated in its entirety by reference.

BACKGROUND OF THE INVENTION

1. Field of the Invention

The present invention relates generally to semiconductor devices. More particularly, the present invention relates to edge termination structures in wide bandgap semiconductor devices using superjunction drift regions, such as silicon carbide semiconductor devices.

2. Description of the Related Art

Superjunction devices have been produced in silicon for many years, as documented by G. Deboy, N. Marz, J. P. Stengl, H. Strack, J. Tihanyi and H. Weber, "A new generation of high voltage MOSFETs breaks the limit line of silicon," in *Proc.* 1998 *International Electron Devices Meeting*, 1998, pp. 683-685. Superjunction drift regions have been simulated in wide energy band gap semiconductors, such as gallium nitride (GaN) and silicon carbide (SiC), as documented by Zhongda Li, H. Naik and T. P. Chow, "Design of GaN and SiC 5-20 kV vertical superjunction structures," in *Lester Eastman Conference on High Performance Devices*, 2012, pp. 1-4. Silicon is the most common semiconductor material; however, it does not perform well in high energy, high temperature switching devices because of intrinsic carrier generation across the band gap. SiC and GaN provide better electrical and thermal characteristics compared to silicon.

Superjunction structures are used to spread the electric potential or voltage, to reduce the electric field across the drift region, and improve the breakdown voltage of the device. Super junction structures take advantage of the depletion characteristics of PN junctions and provide a drift region in the middle of the device where the electric field rises evenly with applied electric potential. The drift region allows the electric field between the P and N type regions to be spread over a larger distance, creating a larger barrier for electron tunneling, and allowing for a slower rise in electric field for avalanche effects. One example of a superjunction semiconductor in the prior art is US 2013/0140633 A1.

Edge terminations are structures around the main device components that are designed to reduce gradients in electric field at geometrical sharp points. The edge of the conductor that contacts the semiconductor device is such a point. This leads to large gradients in electric field at the edge of the contact and premature breakdown at this point relative to the rest of the structure. To avoid breakdown at these high gradient areas, special geometrical structures are incorporated into the design of semiconductor devices.

SUMMARY OF THE INVENTION

Embodiments in accordance with the invention include a semiconductor device having a linked vertical superjunction edge termination structure for the drift region and a method for making the vertical superjunction edge termination structure.

In accordance with one embodiment, an annular semiconductor device having a vertical superjunction edge termination structure for a drift region includes: an N+ type substrate layer having a top surface and a back surface; an N type layer located above the top surface of the N+ substrate layer; a plurality of P type superjunction regions located in the N type layer; a plurality of P type edge termination regions located in the N type layer adjacent the plurality of P type superjunction regions; a P type well located above the plurality of P type superjunction regions and the plurality of P type edge termination regions; a P+ type contact well located in the P type well, the P+ type contact well having a depth D1 and extending horizontally over at least a portion of the plurality of P type superjunction regions; an anode contact located above and in contact with the P+ type contact well; an N type well located in the P type well, the N type well having a depth D2 and extending horizontally over the plurality of P type edge termination regions; a plurality of P+ type floating field regions located in the N type well, each of the plurality of P+ floating field regions having a depth D3; a passivation layer located over at least a portion of a top surface of the N type well and the P type well; and a conductive metal contact layer located and in contact with the back surface of the N+ type substrate layer.

In accordance with one embodiment, a method for forming an annular semiconductor device having a vertical superjunction edge termination structure for a drift region includes: obtaining an N+ type substrate, the N+ type substrate having a top surface and a back surface; forming a first N type layer over the top surface of the N+ type substrate; forming a plurality of superjunction region trenches and a plurality of edge termination region trenches in the first N type layer; etching a portion of the first N type layer to form a first well region; forming a P type layer over the first N type layer, the P type layer filling the plurality of superjunction region trenches to form P type superjunction regions, filling the plurality of edge termination region trenches to form P type edge termination regions, and filling the first well region for form a P well region; planarizing the surface of the P type layer and a remaining unetched portion of the first N type layer; etching the P type layer and a portion of the remaining unetched portion of the first N type layer to form a second well region; forming a second N type layer, the second N type layer filling the second well region to form an N type well; implanting a plurality of P+ type floating field regions in the N type well; implanting a P+ type contact well in a portion of the P type layer; forming an anode contact over a portion of the P+ type contact well; forming a passivation layer over a top surface of the semiconductor device excepting the anode contact; and forming a conductive metal layer on the back surface of the N+ type substrate.

Embodiments in accordance with the invention are best understood by reference to the following detailed description when read in conjunction with the accompanying drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Herein the figures are not drawn to scale, but are set forth to illustrate various embodiments of the invention.

FIG. 8 shown in partial views

Embodiments in accordance with the invention are further described herein with reference to the drawings.

DETAILED DESCRIPTION OF THE INVENTION

Embodiments in accordance with the invention include a vertical superjunction edge termination structure for the drift region of wide bandgap semiconductor devices which provides a low resistance, a high off voltage, and a more energy efficient semiconductor device. This vertical superjunction edge termination structure allows for semiconductor device manufacturers to take advantage of the superjunction characteristic that partially separates the relationship between on state resistance and breakdown voltage of a device drift region. Embodiments in accordance with the vertical superjunction edge termination structure described herein provide lower resistance devices at higher breakdown voltages, enabling higher power devices with lower losses. In some embodiments, the vertical superjunction edge termination structure has applicability in preventing the electric field from peaking at the edge of the anode contact.

Herein the simulated profiles and distributions illustrated in FIGS. 1-7 were performed using SILVACO TCAD (available from SILVACO, Santa Clara, Calif.). As used herein, the letter "N" refers to an N-type dopant and the letter "P" refers to a P-type dopant. A plus sign "+" or a minus sign "−" is used to represent, respectively, a relatively high or relatively low concentration of the dopant. The general concepts of N and P type dopants and the use of the plus or minus sign to represent dopant concentrations are well known to those of skill in the art and not further detailed herein.

Figure 1:
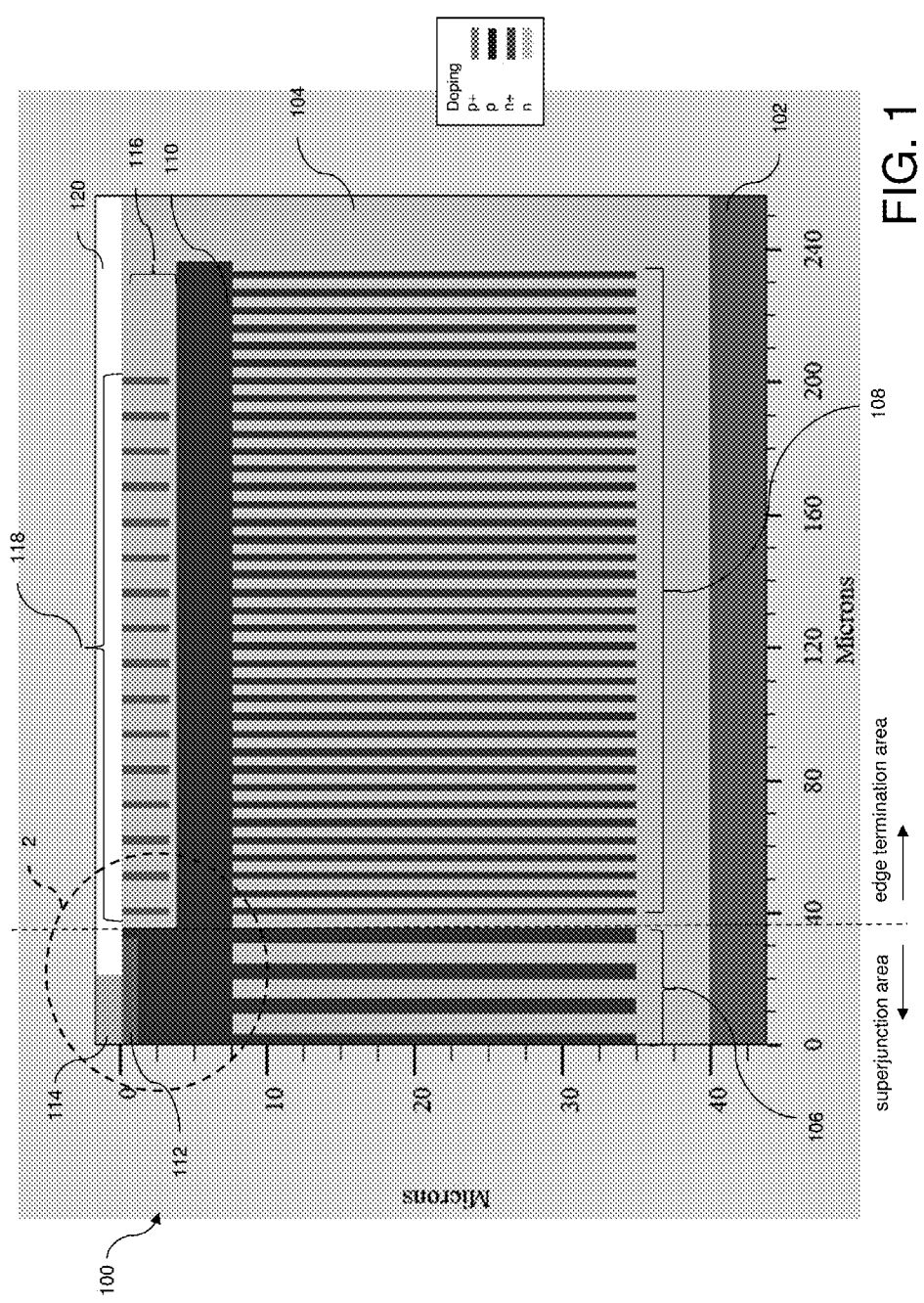
FIG. 1 illustrates a simulated side sectional view of an annular superjunction diode with a vertical superjunction edge termination structure in accordance with one embodiment of the invention.
Figure 2:
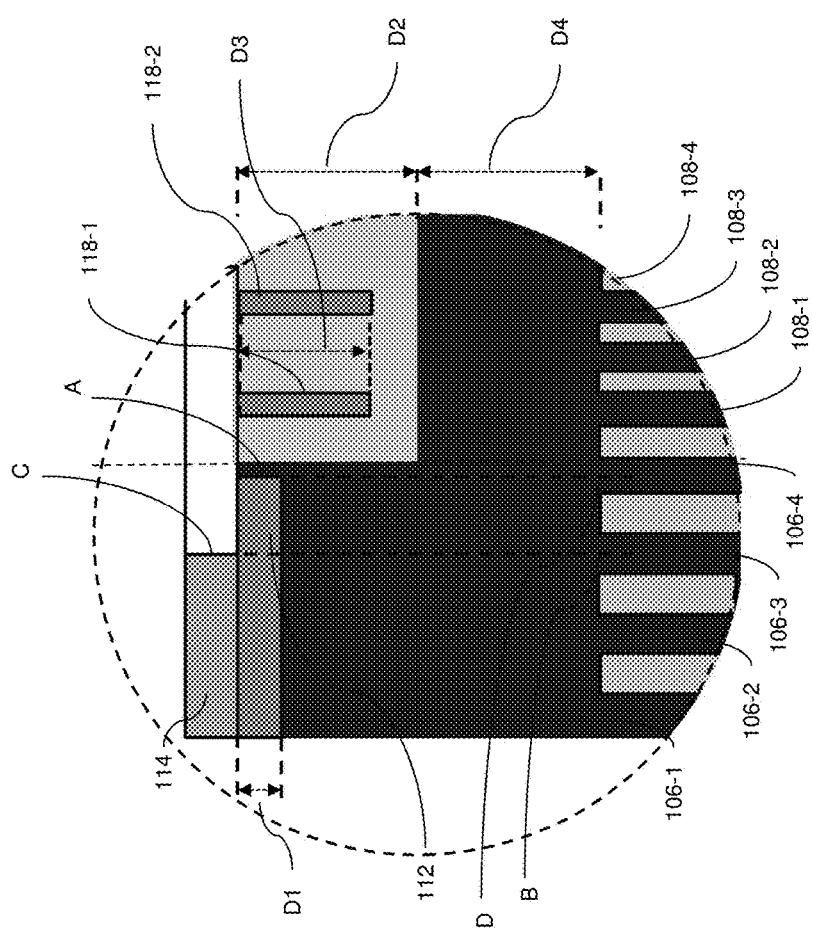
FIG. 2 illustrates an enlarged view of a portion of FIG. 1 in accordance with one embodiment of the invention.

Referring now to FIGS. 1 and 2 together, a simulated side sectional view of an annular superjunction diode with vertical superjunction edge termination structure 100 is illustrated. In one embodiment, the superjunction diode with vertical superjunction edge termination structure 100, herein also referred to as diode 100, is a silicon carbide (SiC) annular diode. In the present embodiment, diode 100 includes an N+ layer 102 which functions as a cathode contact layer and has a top surface and a back surface. An N layer 104, herein also termed a first N layer, is located on the top surface of N+ layer 102. A plurality of P superjunction regions 106 are positioned in an interior portion of N layer 104, herein termed a superjunction area. In one embodiment, each of P superjunction regions 106 are of equal depths. For purposes of illustration, in the present embodiment, four P superjunction regions 106-1, 106-2, 106-3, and 106-4, respectively first, second, third, and fourth P superjunction regions, are shown in the enlarged view of FIG. 2.

In one embodiment, P superjunction region 106-1, as it is centrally located and shown in cross-section, forms a central column having a radius x, herein a first width, and P superjunction regions 106-2 through 106-4, being separated by portions of N layer 104, form ring structures positioned around P superjunction region 106-1. Each of P superjunction regions 106-2, 106-3, 106-4 has a second width equal to $x\sqrt{2}$. P superjunction regions 106 are equally spaced apart horizontally in N layer 104 such that N superjunction regions are formed between each of P superjunction regions 106 and have a same width as a P superjunction region 106-2, 106-3, 106-4.

A plurality of P edge termination regions 108 are positioned in a portion of N layer 104 peripherally adjacent to P superjunction regions 106, herein termed an edge termination area. Being separated by portions of N layer 104, P edge termination regions 108 form ring structures positioned outside P superjunction regions 106. In one embodiment, each of P edge termination regions 108 are of equal depths. In one embodiment, the depths of P edge termination regions 108 are equal to the depths of P superjunction regions 106. For purposes of illustration, in the present embodiment, thirty-seven (37) P edge termination regions 108-1, 108-2 . . . 108-37 are shown in FIG. 1.

In one embodiment, each of P edge termination regions 108 has a third width equal to one-half the second width of a P superjunction region 106-2, 106-3, 106-4. P edge termination regions 108 are equally spaced apart horizontally in N layer 104 such that N edge termination regions are formed between each of P edge termination regions 108 and have a same width as a P edge termination region 108. In one embodiment, in which P superjunction region 106-1 has a first width, x, and each of P superjunction regions 106-2, 106-3, 106-4 has a second width of $x\sqrt{2}$, each of P edge termination regions 108 has a third width equal to $$\frac{x\sqrt{2}}{2}.$$

In one embodiment, the N superjunction region separating P superjunction region 106-4 and P edge termination region 108-1 is formed having a width that is approximately an average of the widths of P superjunction region 106-4 and P edge termination region 108-1 in order to maintain charge balance, i.e., an average of the second width and the third width. A P layer 110, also termed a P well or P drift region, is located above P superjunction regions 106 and P edge termination regions 108 and within N layer 104 to form a horizontal conductive region that links all of P superjunction regions 106 and P edge termination regions 108 conductively.

In the superjunction area, a P+ contact well 112 having a depth D1 is located in P layer 110 and positioned vertically above and extends horizontally over P superjunction regions 106-1, 106-2, 106-3, with an outer edge A of P+ contact well 112 terminating at or near a centerline B of P superjunction region 106-4. An anode contact 114, such as an ohmic contact, is located above a portion of P+ contact well 112. In one embodiment, anode contact 114 is located above P+ contact well 112 and extends horizontally over P superjunction regions 106-1 and 106-2 and an outer edge C of anode contact 114 terminates at or near a centerline D of P superjunction region 106-3.

In the edge termination region, an N well 116, also termed an N drift region, is located in P layer 110 vertically over the plurality of P edge termination regions 108, beginning outside of superjunction region 106-4. In one embodiment, N well 116 has a depth D2 nthat is four times the depth D1 of P+ contact well 112. A plurality of P+ floating field regions 118 are formed in N well 116. P+ floating field regions 118, being separated by portions of N well 116, form ring structures within N well 116. In one embodiment, each P+ floating field region 118 has a depth D3 that is three times the depth D1 of P+ contact well 112. For purposes of illustration, in the present embodiment, sixteen (16) P+ floating field regions 118, for example, P+ floating field regions 118-1, . . . , 118-16, are formed in N well 116. In one embodiment, P+ floating field regions 118 have a fourth width and are horizontally spaced apart so that they are positioned vertically over every other P edge termination region 108. In one embodiment, a passivation layer 120 is located over a top surface of diode 100, but not covering anode contact 114.

As earlier described, outer edge C of anode contact 114 terminates above a P superjunction region 106, i.e., above superjunction region 106-3, rather than a separating region of N layer 104, i.e., an N superjunction region, to reduce the effect of the electric field peak at the outer edge corner of anode contact 114. Even with anode contact 114 completely inside P+ contact well 112 above P superjunction region 106-2, whether P+ contact well 112 terminates above a P superjunction region 106 has an effect. In the present embodiment, outer edge A of P+ contact well 112 extends to a next P superjunction region 106-4 over from outer edge C of anode contact 114 in order to give the electric field from anode contact 114 room to spread into P+ contact well 112. The P+ doping level of P+ contact well 112 provides low resistance contact and enables the N well 116 depletion regions to allow potential to drop between one or more P+ floating field regions 118 formed in device 100.

In one embodiment, the depth D1 of P+ contact well 112 is set based on the breakdown voltage depletion width for the P superjunction region 106 and N superjunction region doping. The depth D1 of P+ contact well 112 should be set deep enough to provide carriers to lower the resistance for forward bias. In order to keep outer edge A corner of P+ contact well 112 from developing too sharp an electric field, the plurality of P+ floating field regions 118 are placed in N well 116. P+ floating field regions 118 are designed to allow the potential difference from N+ layer 102 to P+ contact well 112 to drop over several depletion regions.

The depth D2 of N well 116, in which P+ floating field regions 118 are located, is equal to the width of a P edge termination region 108. The depth D2 of N well 116 is equal in depth vertically to the depth D4 of the portion of P layer 110 located beneath N well 116 to provide charge balance out at the end of the edge termination region allowing P edge termination regions 108 to deplete before N well 116 and the portion of P layer 110 located beneath N well 116. In one embodiment, the width of N well 116 is within a range between 200 and 230 microns horizontally.

The vertical stacking of N well 116 and P layer 110 is intended to provide a superjunction effect for absorbing horizontal electric field at the end of the edge termination region. The superjunction effect can be seen in the horizontal electric field cut line in FIG. 3 in the range from 200 to 230 microns. The electric field in this region maintains a relatively constant value similar to the electric field profiles in the vertical cuts through the superjunction in FIG. 4 and FIG. 5.

N well 116 and the matching underlying portion of P layer 110 are thick to enable charge conduction from the furthest superjunction edge termination region 108 in the edge termination region. If the underlying portion of P layer 110 is thinner, the furthest P edge termination region 108, at approximately 230 microns in the present example, would not fully deplete resulting in extra charge in the superjunction region and a charge imbalance. The charge imbalance results in a lowered breakdown voltage because the electric field would have less distance at a high value and the potential would not be able to decrease as much before creating a low resistance channel to anode contact 114.

As earlier described, in one embodiment, each P edge termination region 108 has a third width that is one-half the second width of a P superjunction region 106-2, 106-3, 106-4. P edge termination regions 108 are thinner to ensure they deplete before P superjunction regions 106 deplete. This also lowers the rise and fall of the electric field in the horizontal direction through the edge termination region, enabling the edge termination region to have a higher average electric field before reaching the critical electric field. Additionally, spacing out P+ floating field regions 118 above every other edge termination region 108 provides room for potential to drop between each P+ floating field region 118. If P+ floating field regions 118 were instead located above every edge termination region 108, N well 116 would not have enough charge balance to keep the P+ regions of P+ floating field regions 118 from matching the potential of P layer 110 located below N well 116. This would cause all floating P+ floating field regions 118 to maintain the same potential, which is not the desired effect of having a series of P+ floating field regions 118.

By spacing P+ floating field regions 118 out horizontally, N well 116 can deplete a portion of the charge from the P regions of P edge termination regions 108 and allow P+ floating field regions 118 to internally reach different voltages. In alternative embodiments, P+ floating field regions 118 can be formed shorter, i.e., depth D3 can be less than three times the depth D1 of P+ contact well 112, and thus located further from P well 110, but this shortening would need to be balanced against the need to keep the corner of outer edge A of P+ contact well 112 from developing a high electric field.

Figure 3:
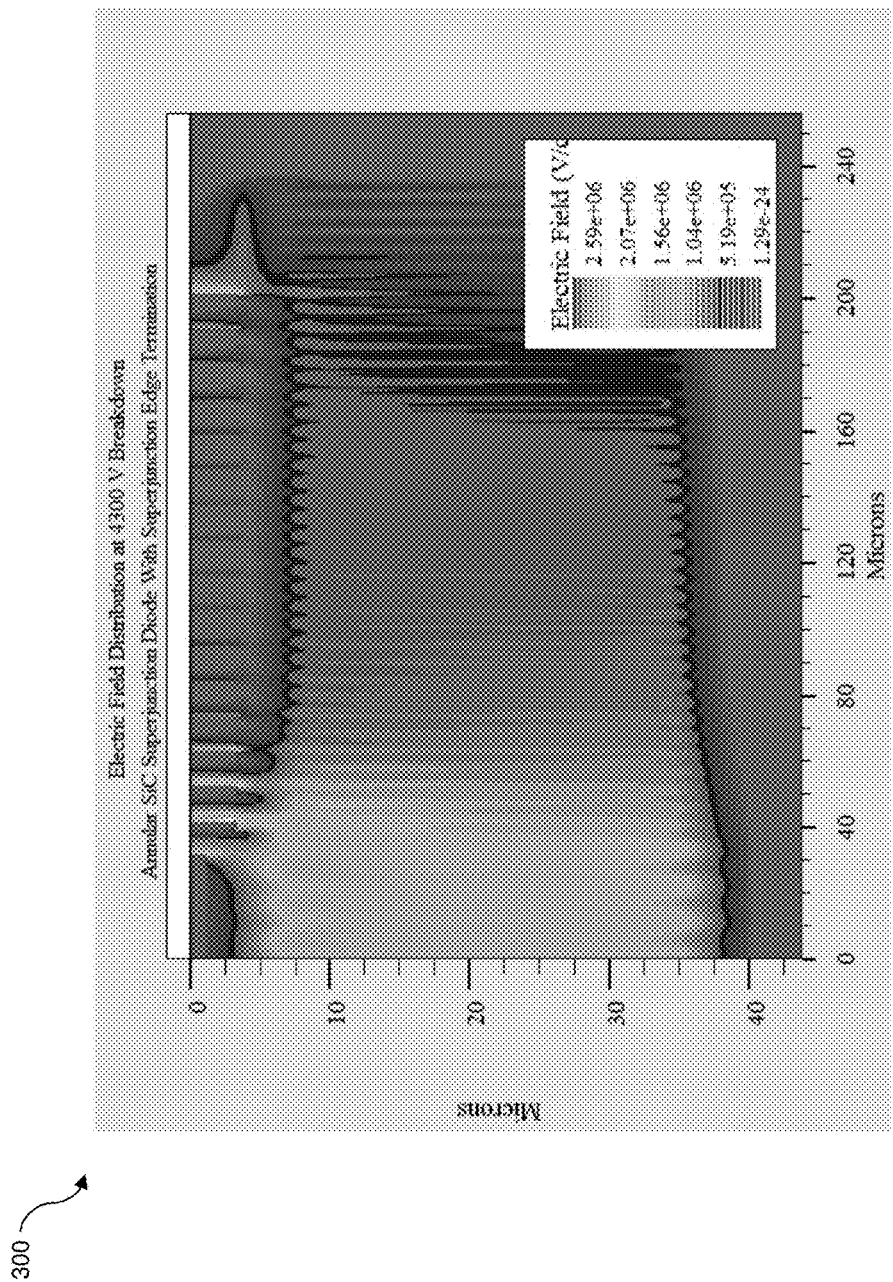
FIG. 3 illustrates a simulated electric field distribution in the superjunction diode with vertical superjunction edge termination structure of FIG. 1 at 4300 V applied reverse bias in accordance with one embodiment of the invention.
Figure 4:
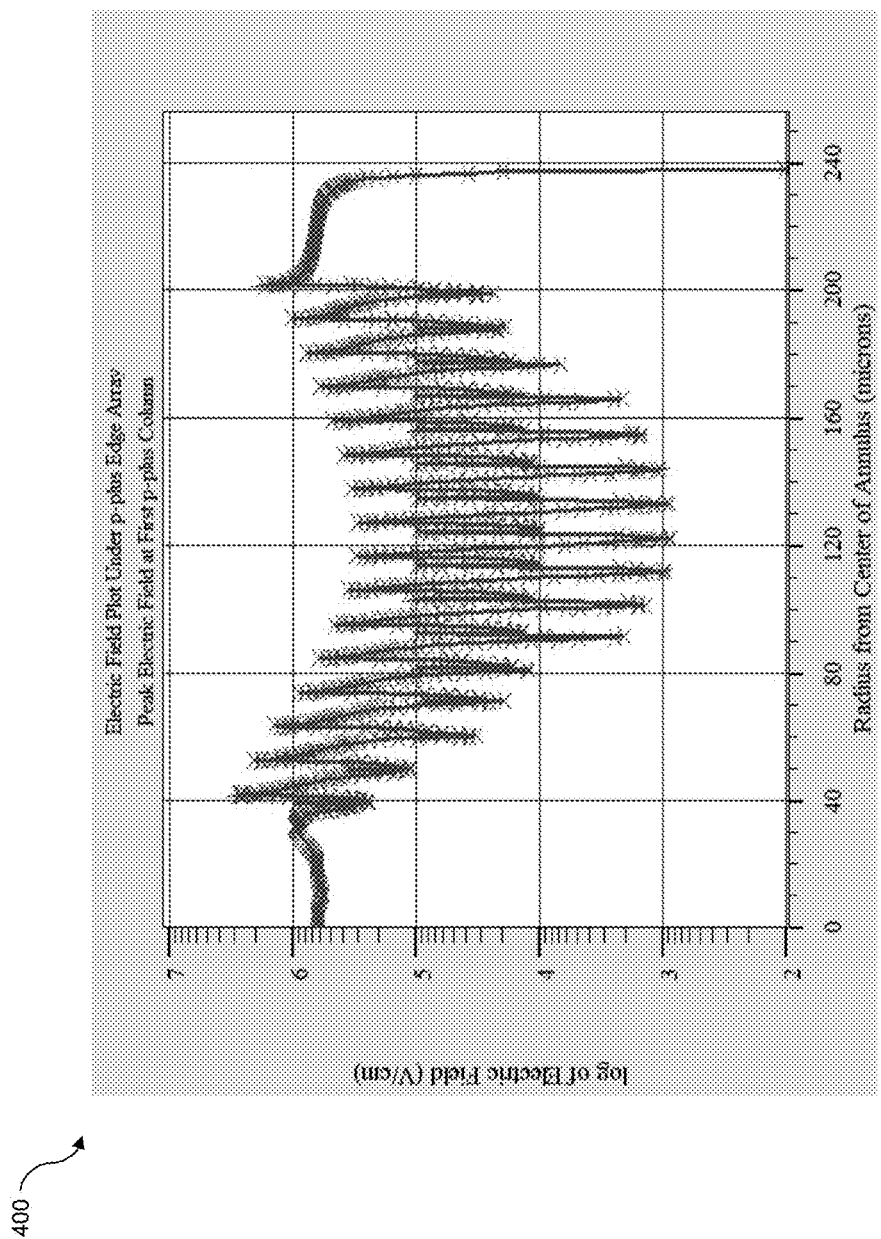
FIG. 4 illustrates the simulated logarithmic electric field distribution in a horizontal cutline across the top of the superjunction diode with vertical superjunction edge termination structure of FIG. 1 at 4300 V applied reverse bias in accordance with one embodiment of the invention.
Figure 5:
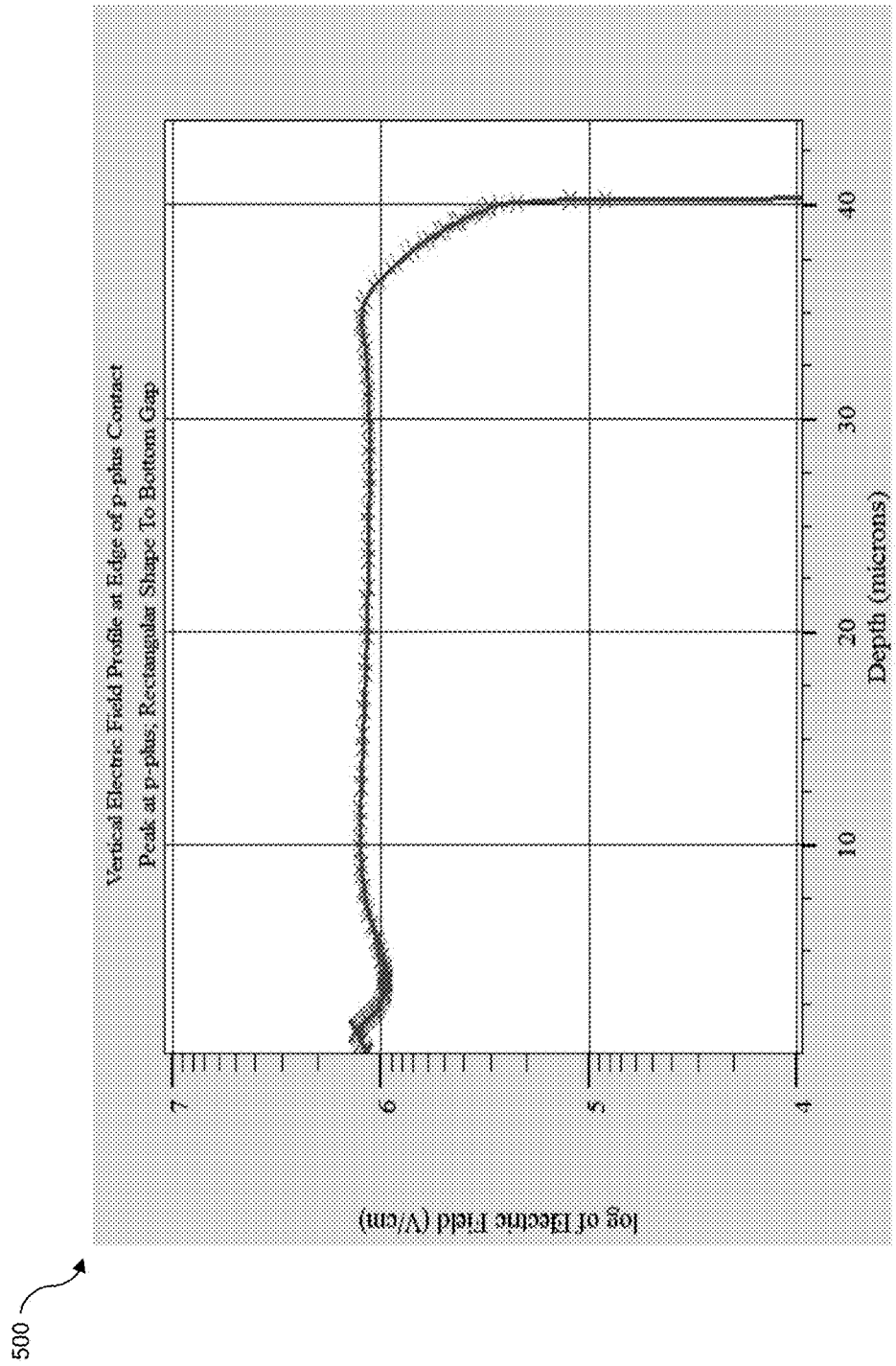
FIG. 5 illustrates the simulated logarithmic electric field distribution in a vertical cutline along the edge of the P+ contact region in the superjunction diode with vertical superjunction edge termination structure of FIG. 1 at 4300 V applied reverse bias in accordance with one embodiment of the invention.
Figure 6:
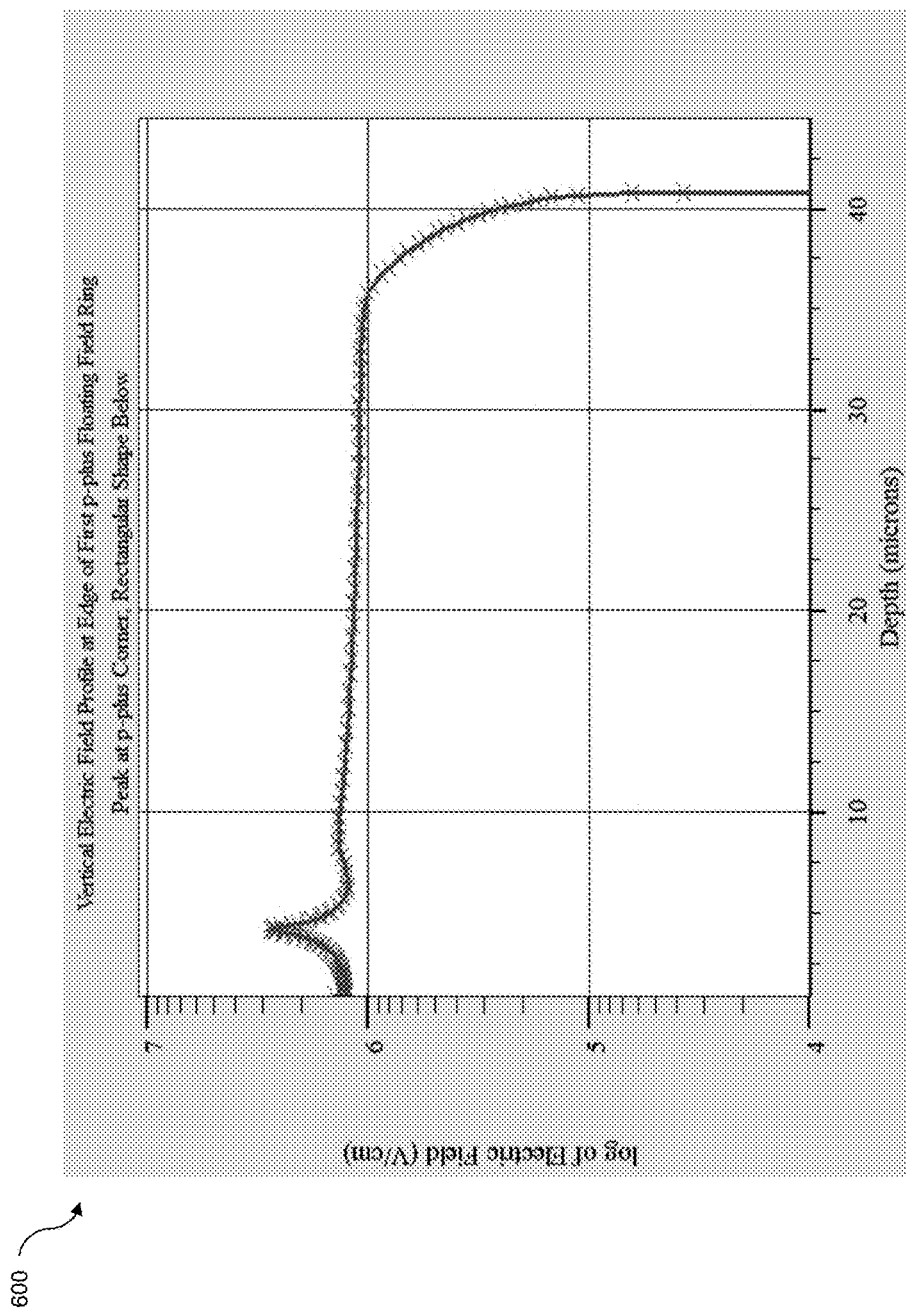
FIG. 6 illustrates the simulated logarithmic electric field distribution in a vertical cutline at the first floating field region in the superjunction diode with vertical superjunction edge termination structure of FIG. 1 at 4300 V applied reverse bias in accordance with one embodiment of the invention.
Figure 7:
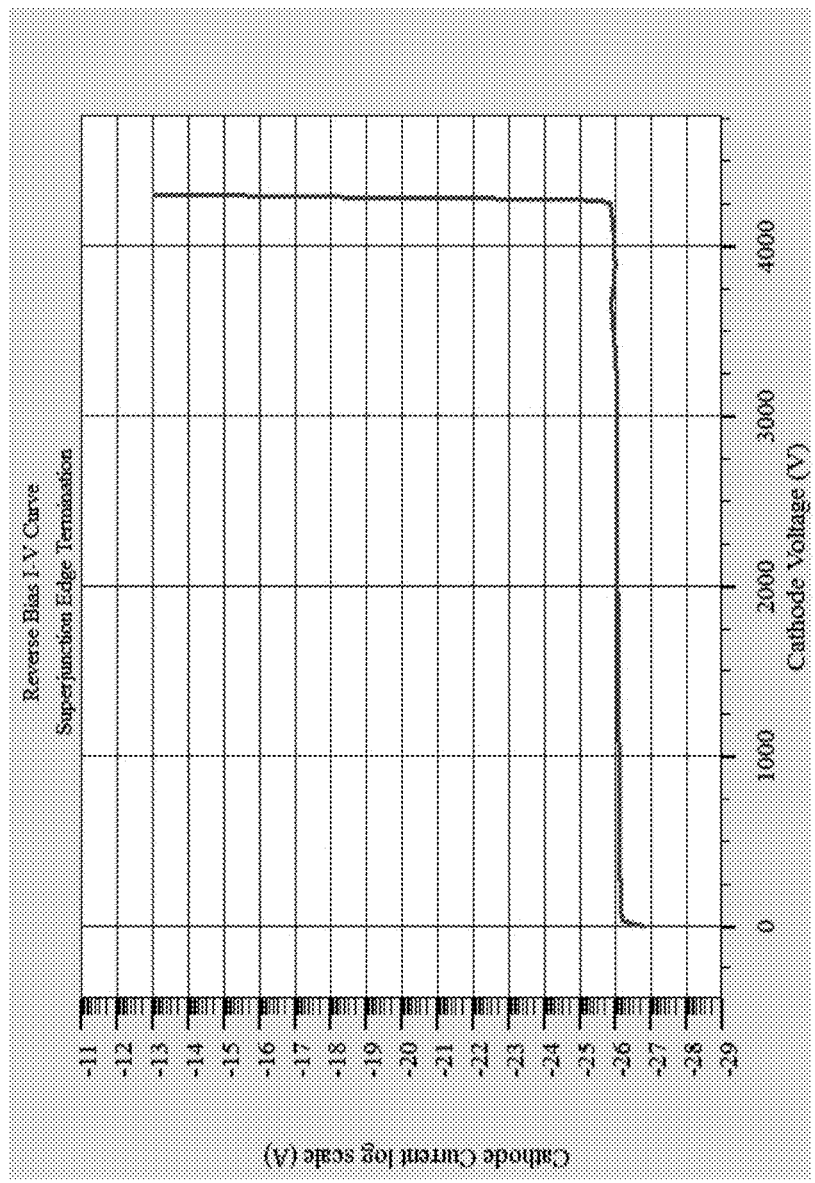
FIG. 7 illustrates a reverse bias current-voltage curve of the superjunction diode with vertical superjunction edge termination structure of FIG. 1 with anode voltage held at 0 V in accordance with one embodiment of the invention.

As shown in the electric field diagram of FIG. 3, the peak electric field occurs at a corner of a first P+ floating field region 118, e.g., P+ floating field region 118-1. A more desirable location for the peak electric field is a last P+ floating field region, e.g., P+ floating field region 118-16. With reference to the chart in FIG. 4, the corner of last P+ floating field region 118-16, is not greatly below the electric field of first P+ floating field region 118-1. Additional regions of P edge termination regions 108 and P+ floating field regions 118 are unlikely to raise the breakdown voltage much higher as another simulation run with an edge termination region ending at 160 microns vice 200 microns resulted in a breakdown voltage of 4293.75 V compared with 4295.84 V. Thus, the simulations detailed herein show that by implementing a vertical superjunction edge termination structure in accordance with the invention, the breakdown voltage of the superjunction drift region can be raised.

Figure 8A:
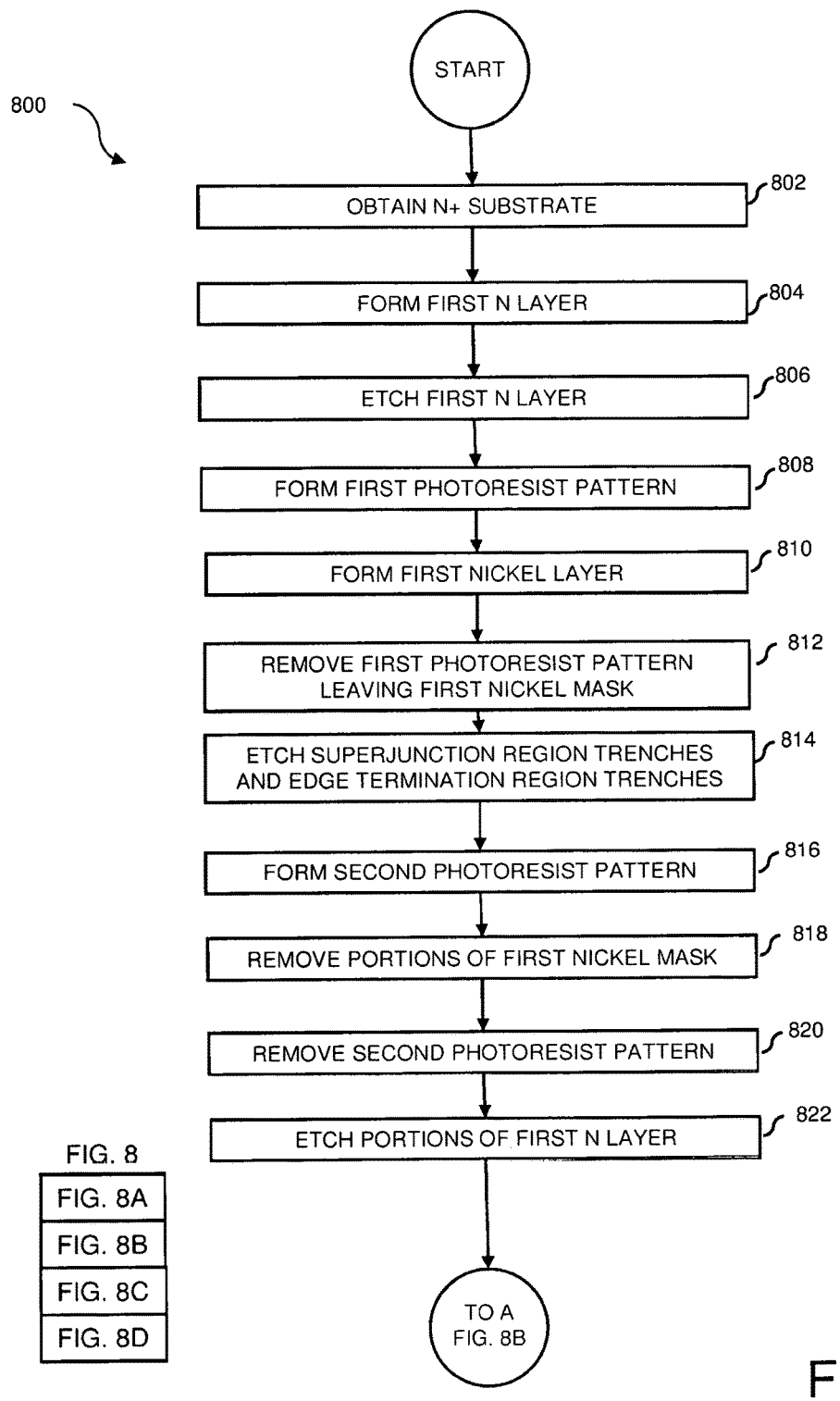
FIGS. 8A, 8B, 8C and 8D illustrates an example process flow diagram for a method for fabricating a vertical superjunction edge termination structure in a semiconductor device in accordance with one embodiment of the invention.

FIG. 8 shown in partial views FIGS. 8A, 8B, 8C, and 8D illustrates an example process flow diagram for one embodiment of a method for fabricating a vertical superjunction edge termination structure in an annular semiconductor device in accordance with one embodiment of the invention. FIGS. 9A-9HH illustrate a side sectional view of the formation of a vertical superjunction edge termination structure in an annular semiconductor device in accordance with one embodiment of the invention. Referring now to FIG. 8A and FIG. 9A together, in operation 802, an N+ wafer is obtained and utilized to form a substrate N+ layer 902 having a top surface and a back surface. In one embodiment, a 1E18 N-type SiC 4° (degree) off-axis wafer is obtained and used to form N+ layer 902. The 1E18 refers to the concentration per cubic centimeter of doping atoms in the semiconductor crystal which make the semiconductor N type or P type, as is well known in the art. In one embodiment, N+ layer 902 is obtained at or thinned down to a thickness of 5 µm (microns).

Figure 9A:
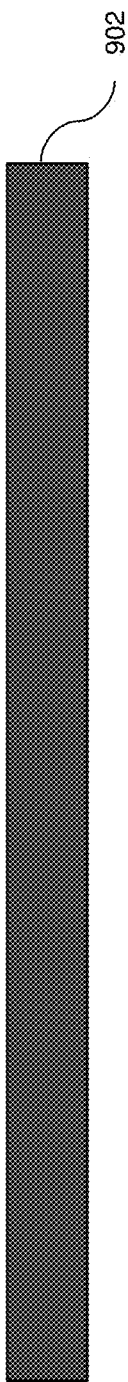
FIGS. 9A-9HH illustrate side sectional views of the formation of a vertical superjunction edge termination structure in an annular semiconductor device in accordance with one embodiment of the invention.
Figure 9B:
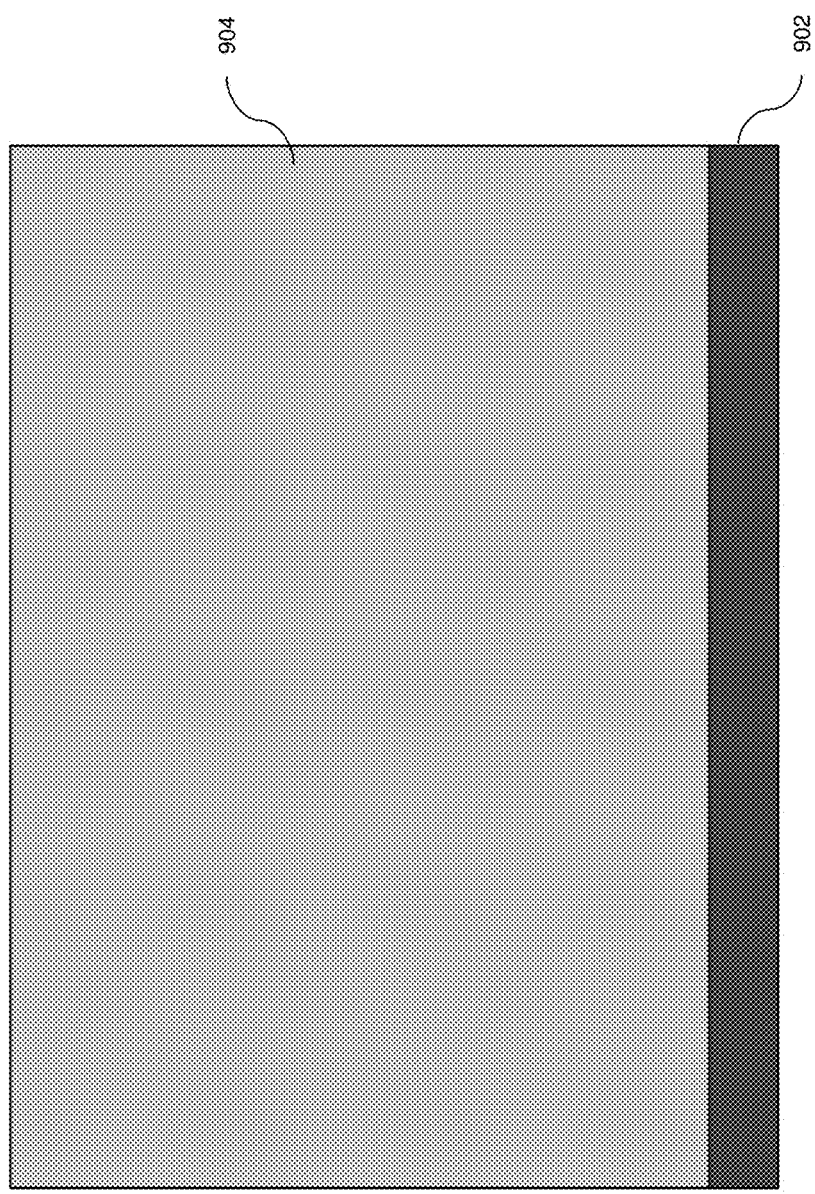

In operation 804, a first N layer 904 is formed on the top surface of N+ layer 902 as illustrated in FIG. 9B. In one embodiment, first N layer 904 is a 40 µm 2E16 N-type SiC layer. First N layer 904 can be formed by epitaxial growth, or using other selected methods well-known to those of skill in the art.

In operation 806, the substrate N+ layer 902 is etched on the back surface for reference points (not shown). As is well known to those of skill in the art, the backside etching serves as a reference point for aligning future fabrication steps.

Figure 9E:
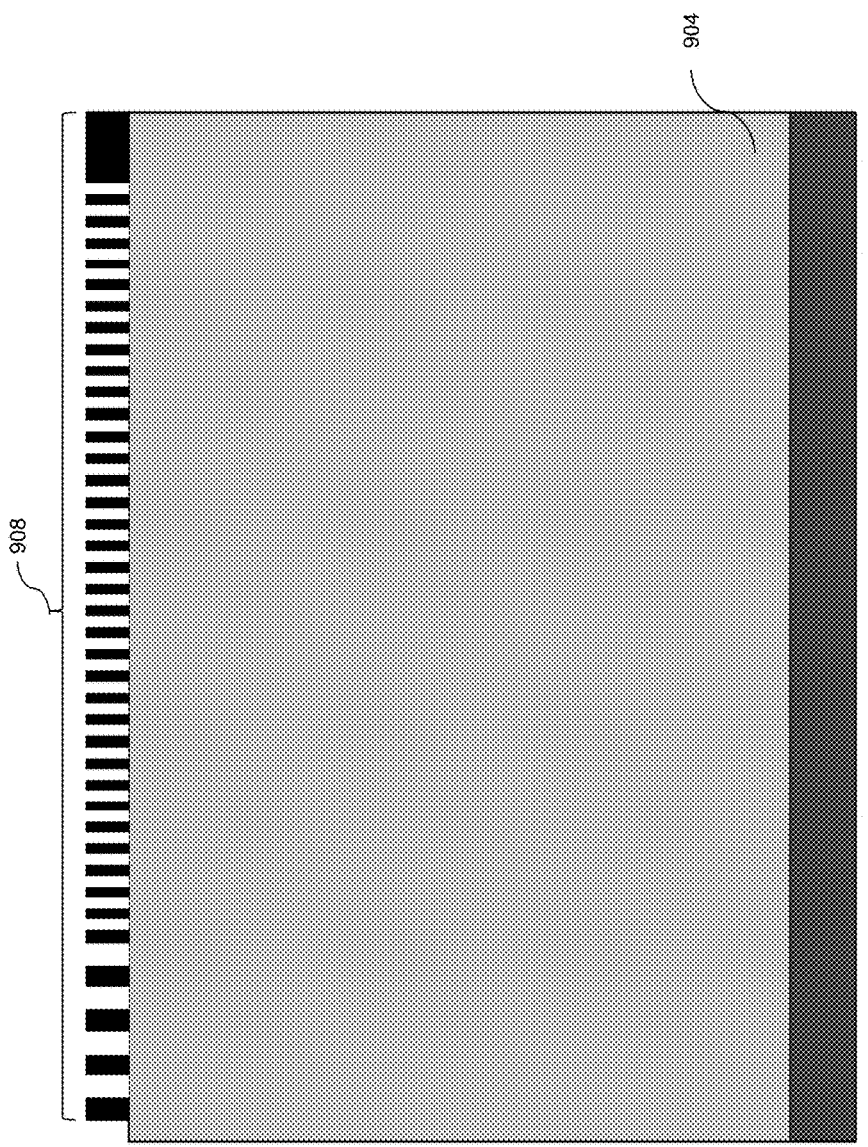
Figure 9F:
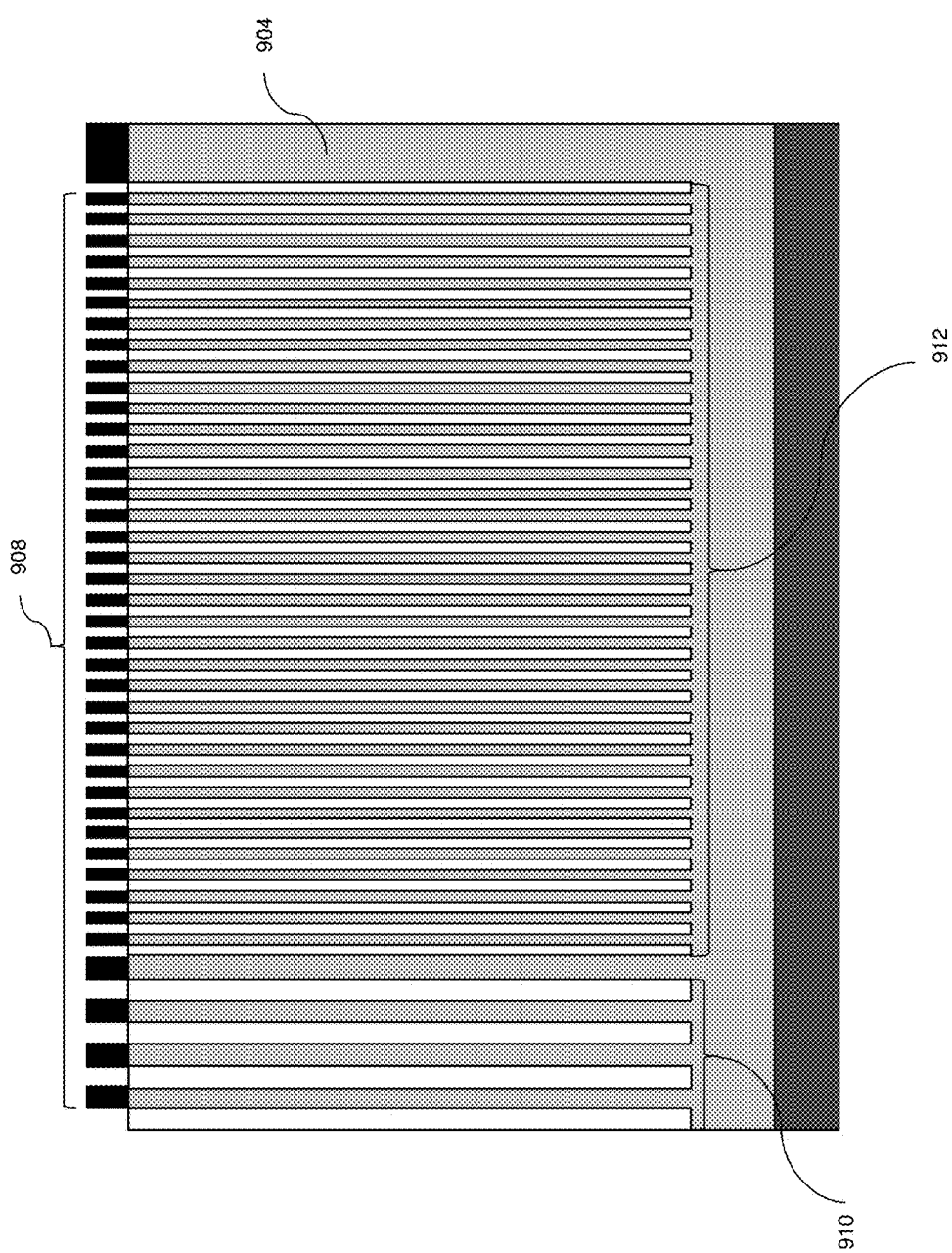
Figure 9G:
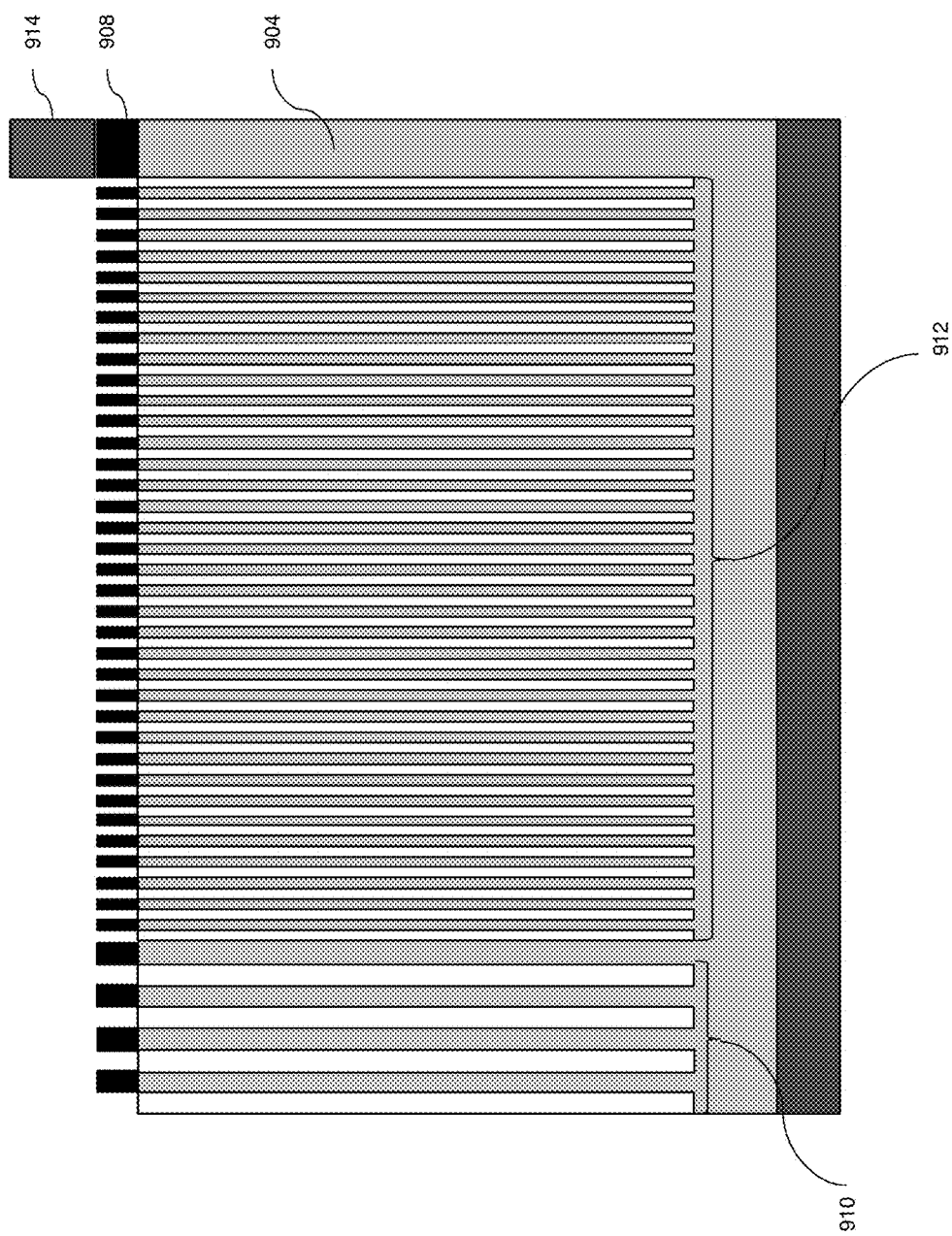
Figure 9H:
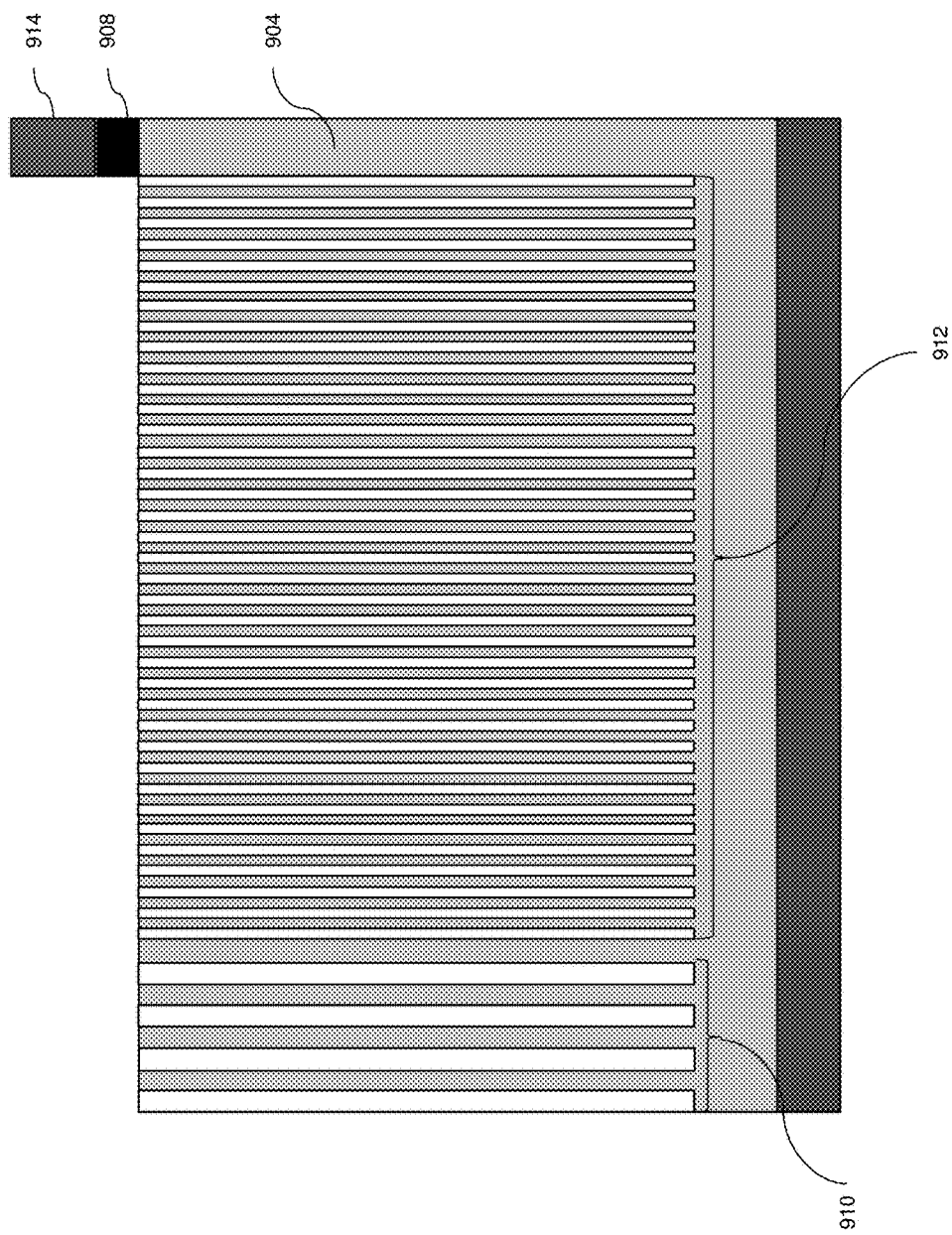
Figure 9I:
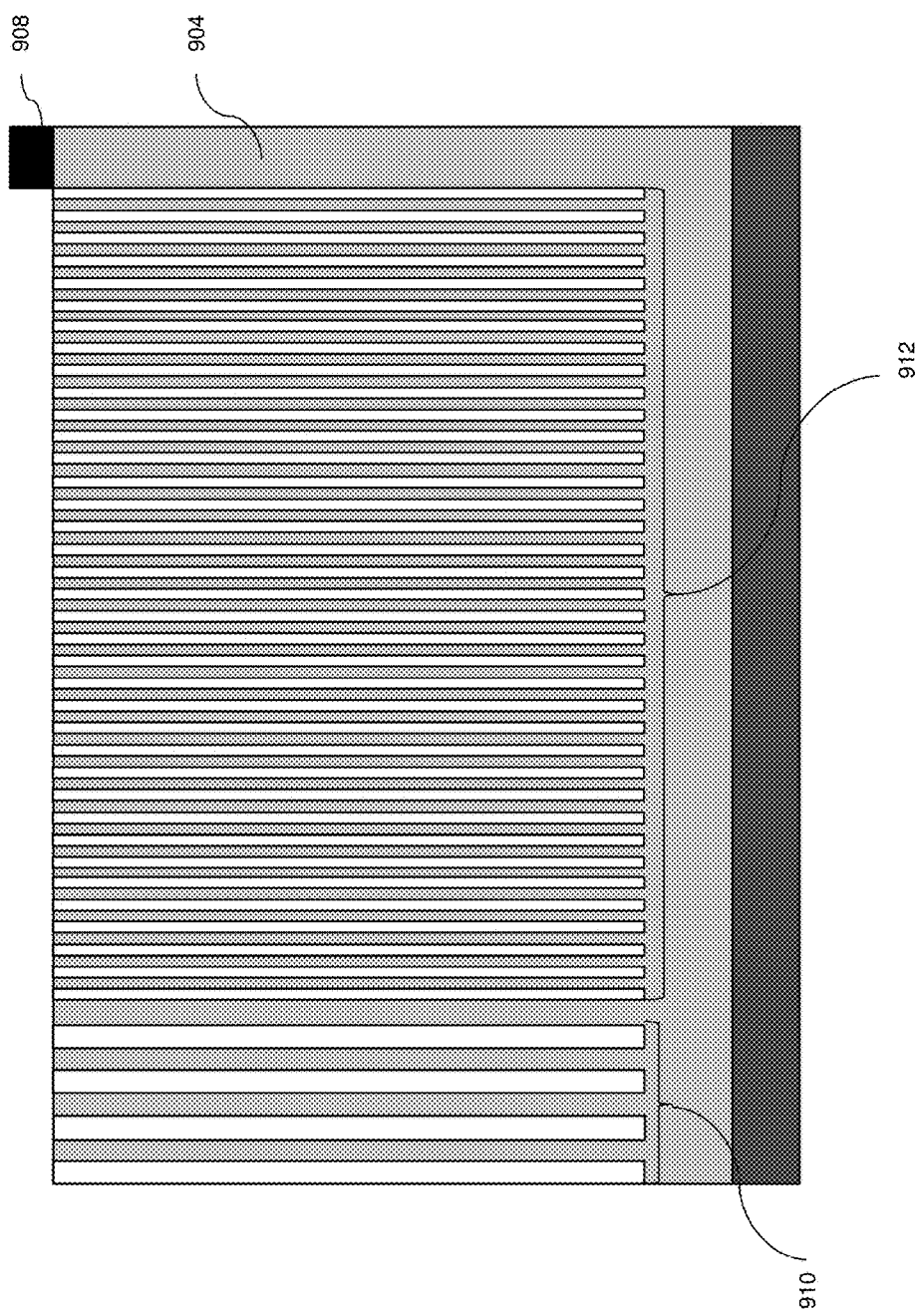
Figure 9J:
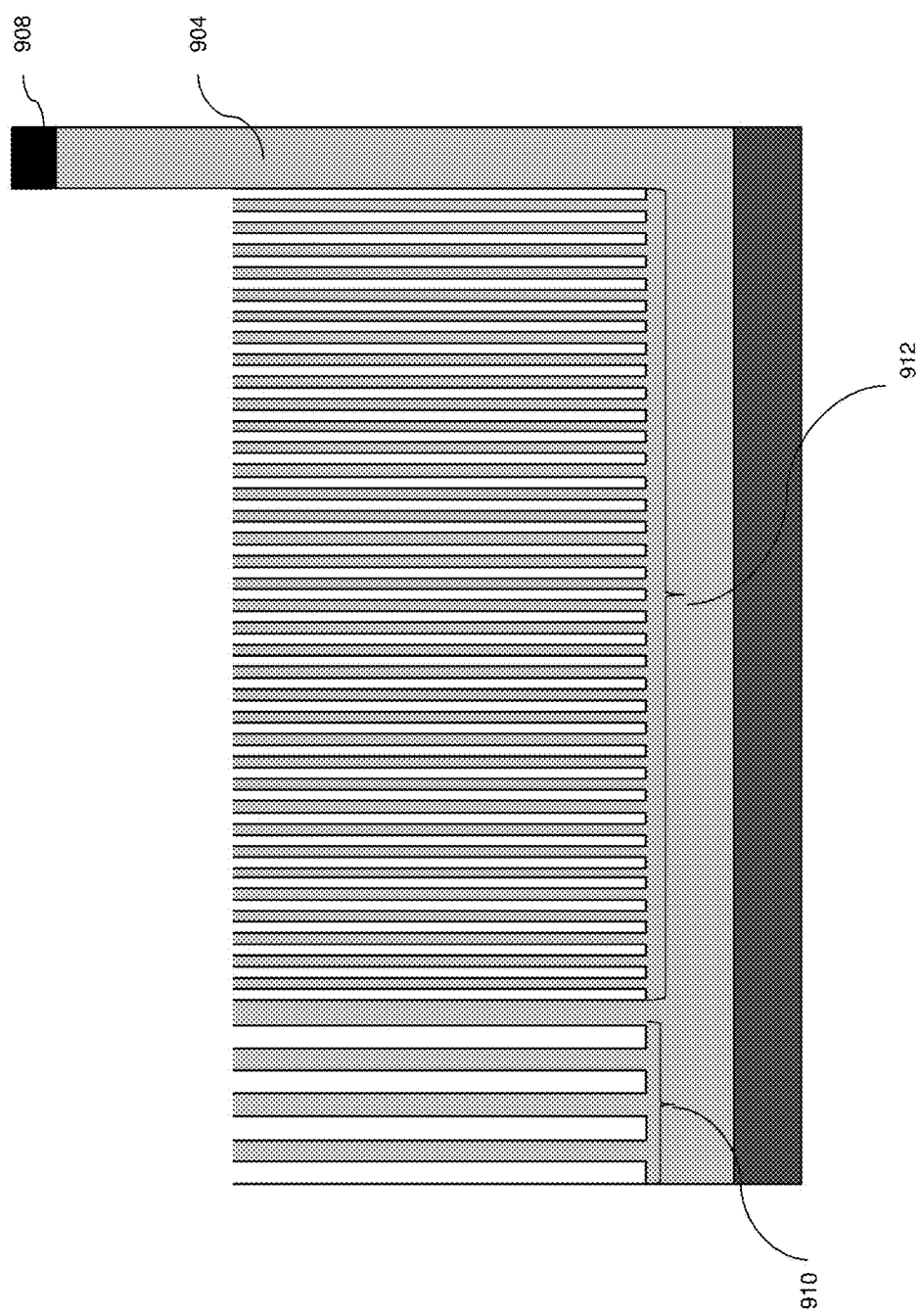
Figure 9K:
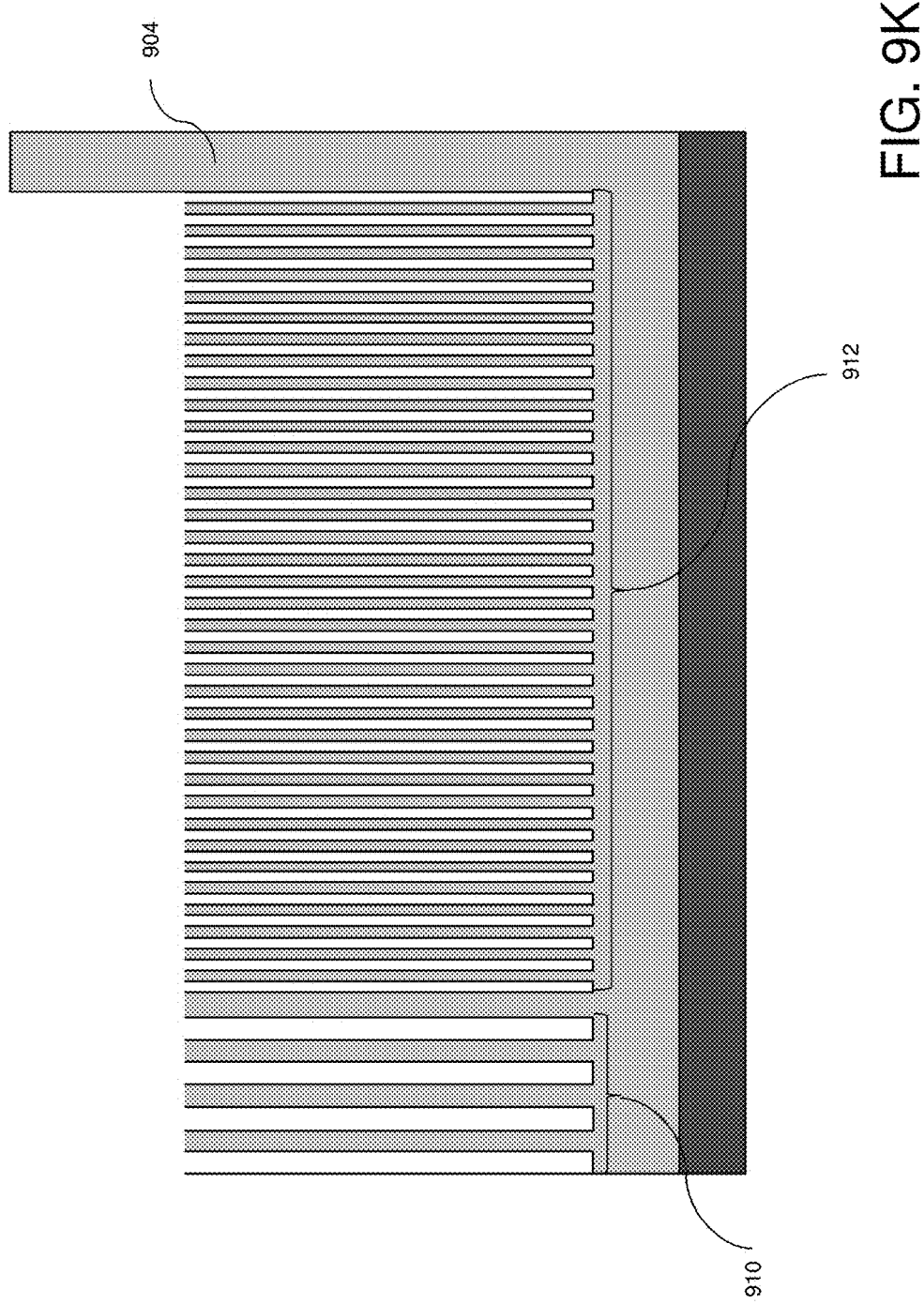
Figure 9L:
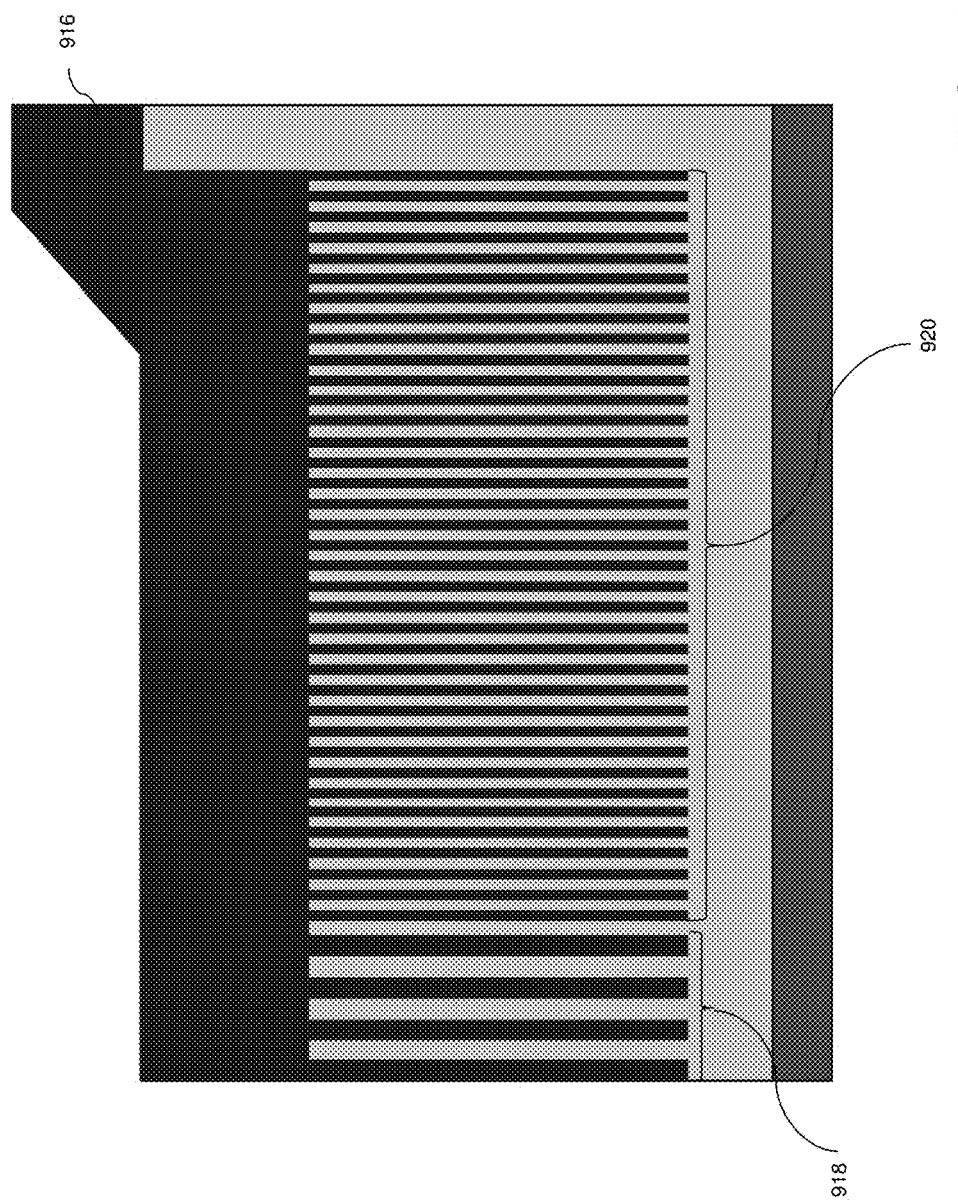
Figure 9M:
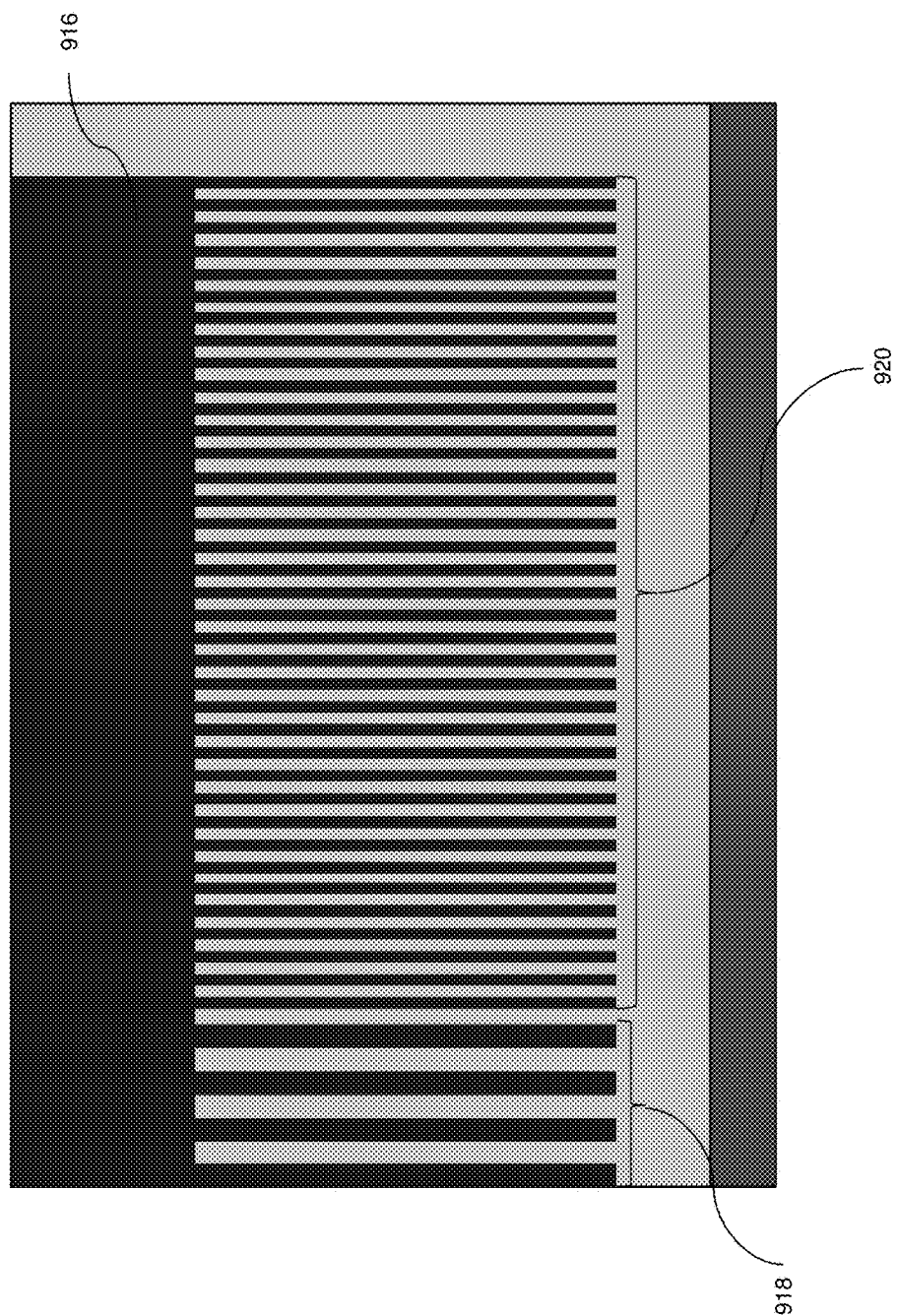
Figure 9N:
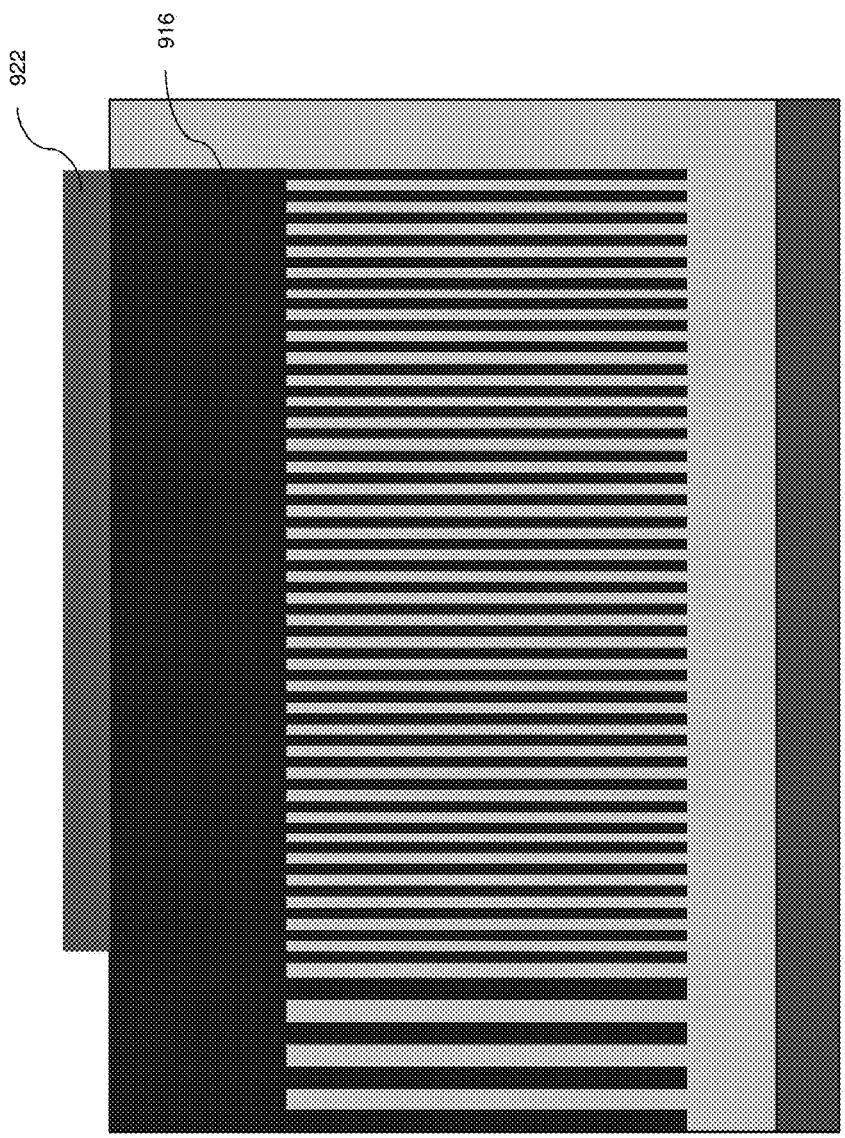
Figure 9O:
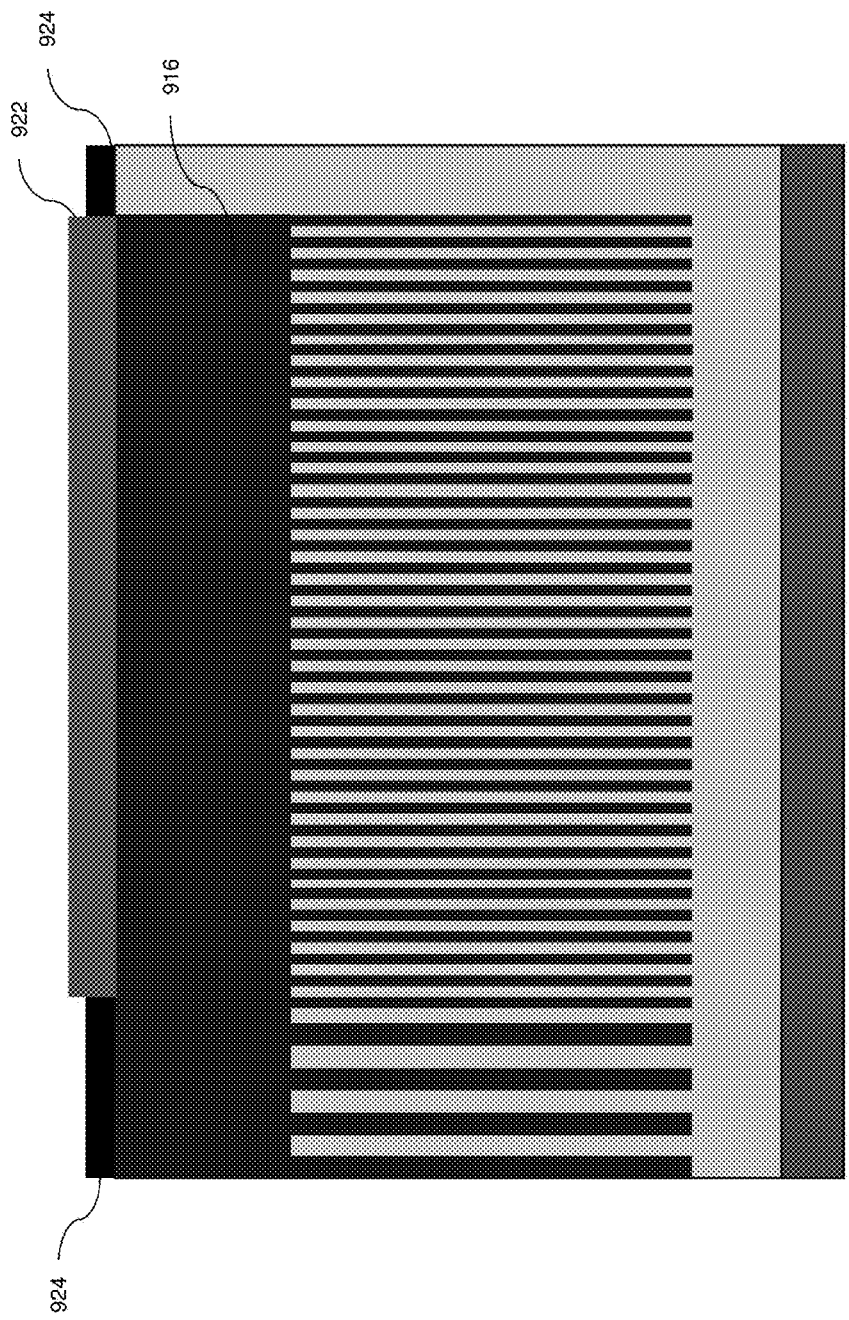
Figure 9Q:
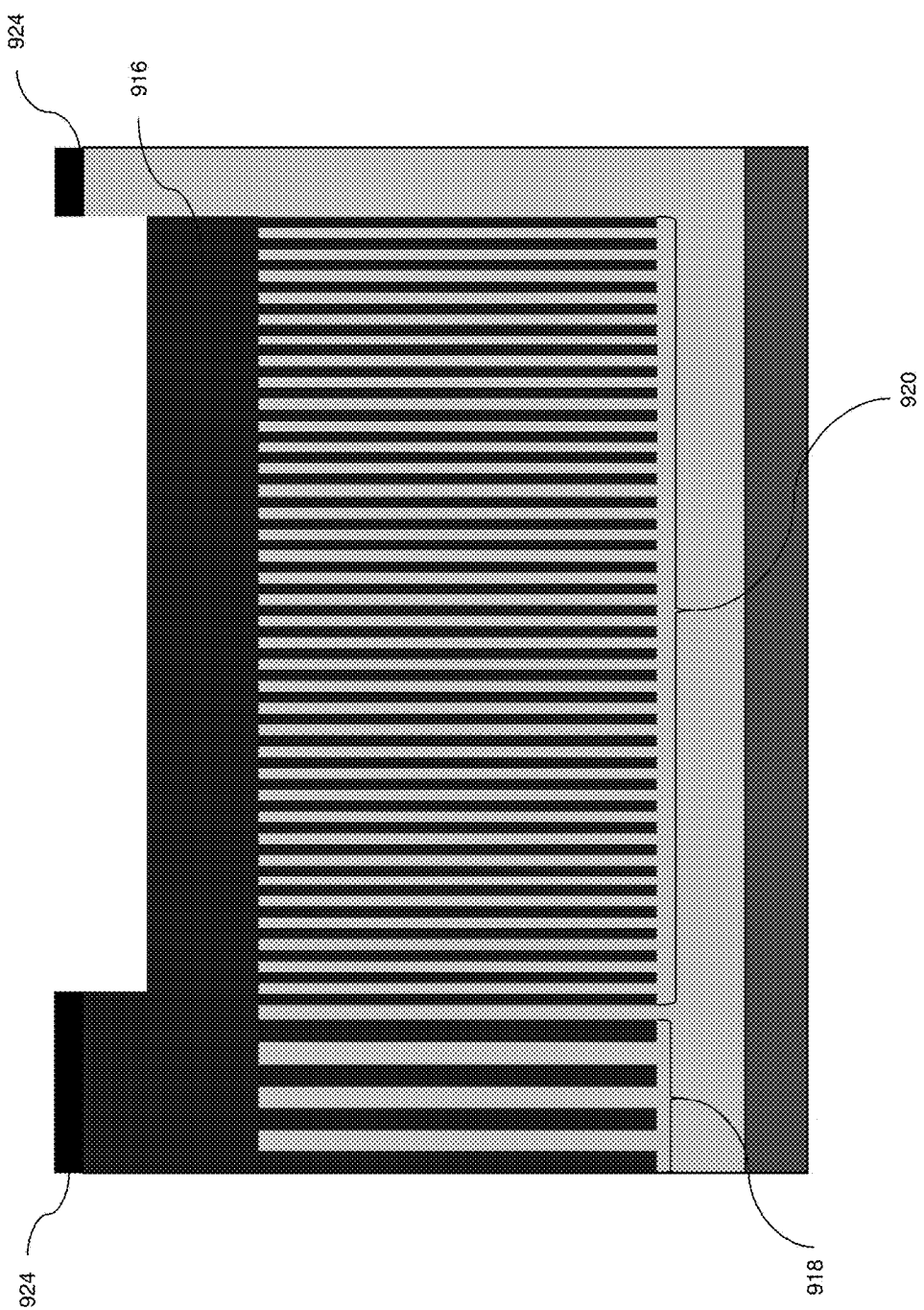
Figure 9R:
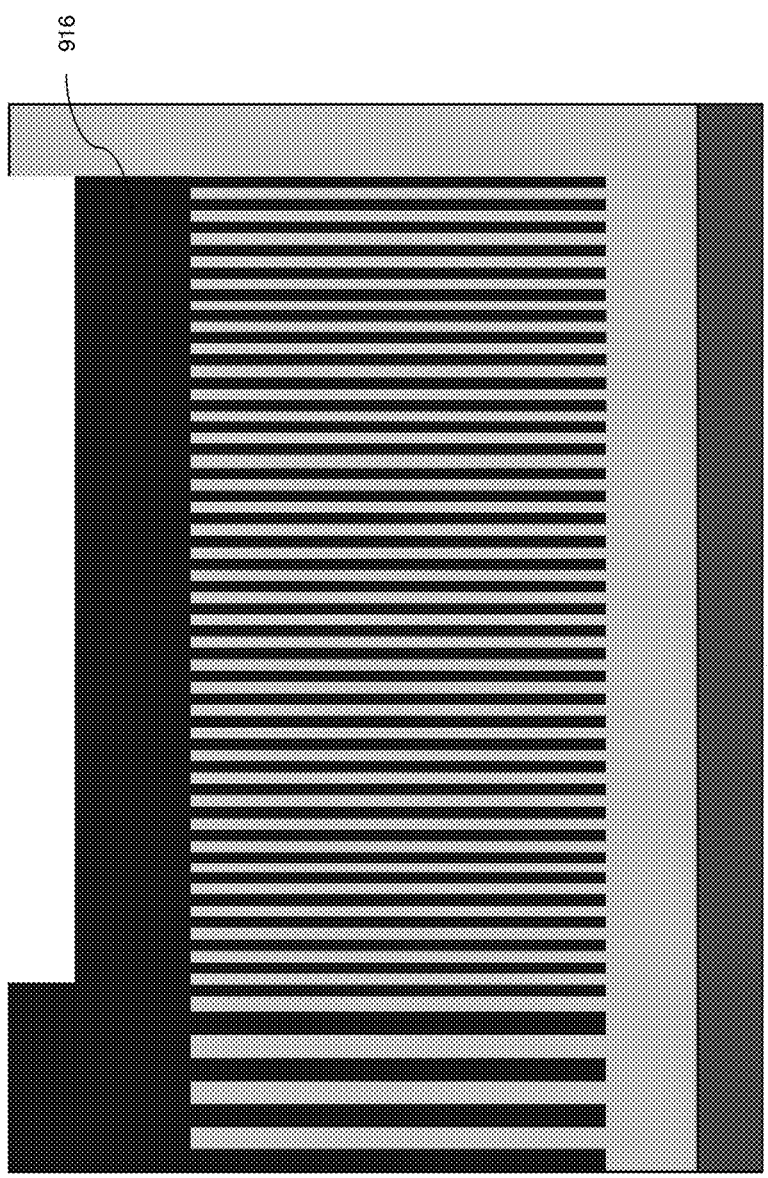
Figure 9S:
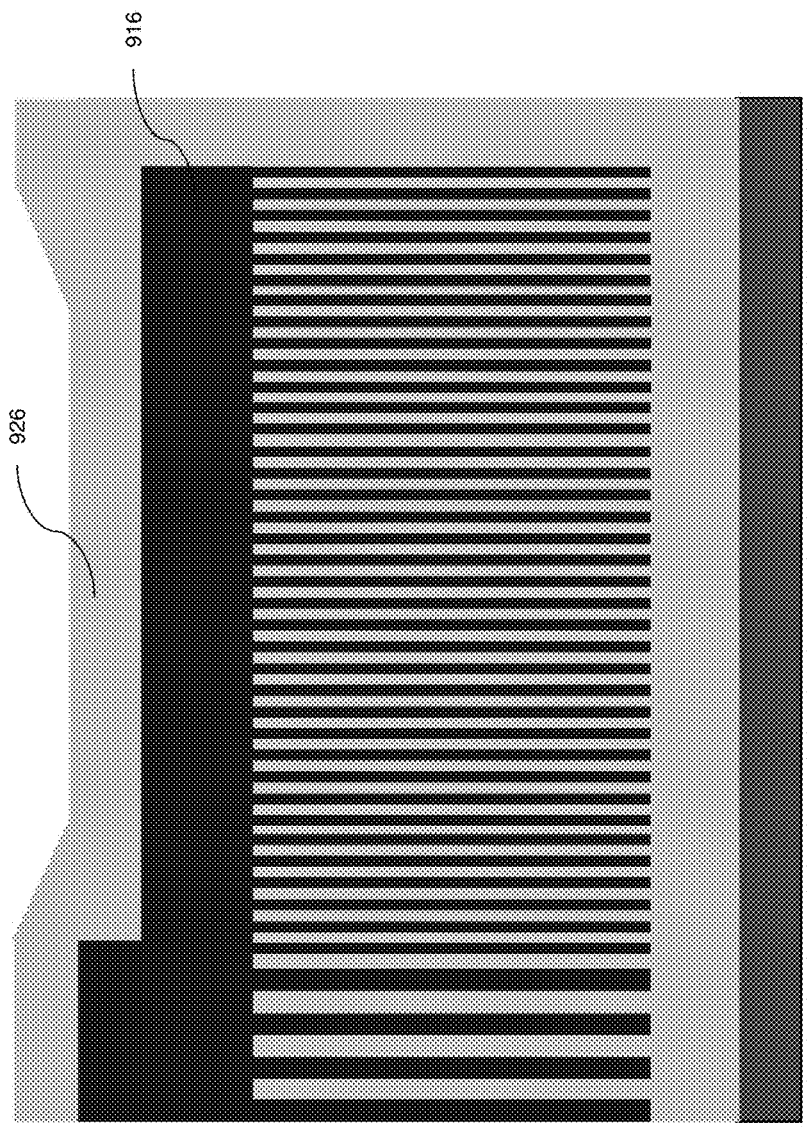
Figure 9T:
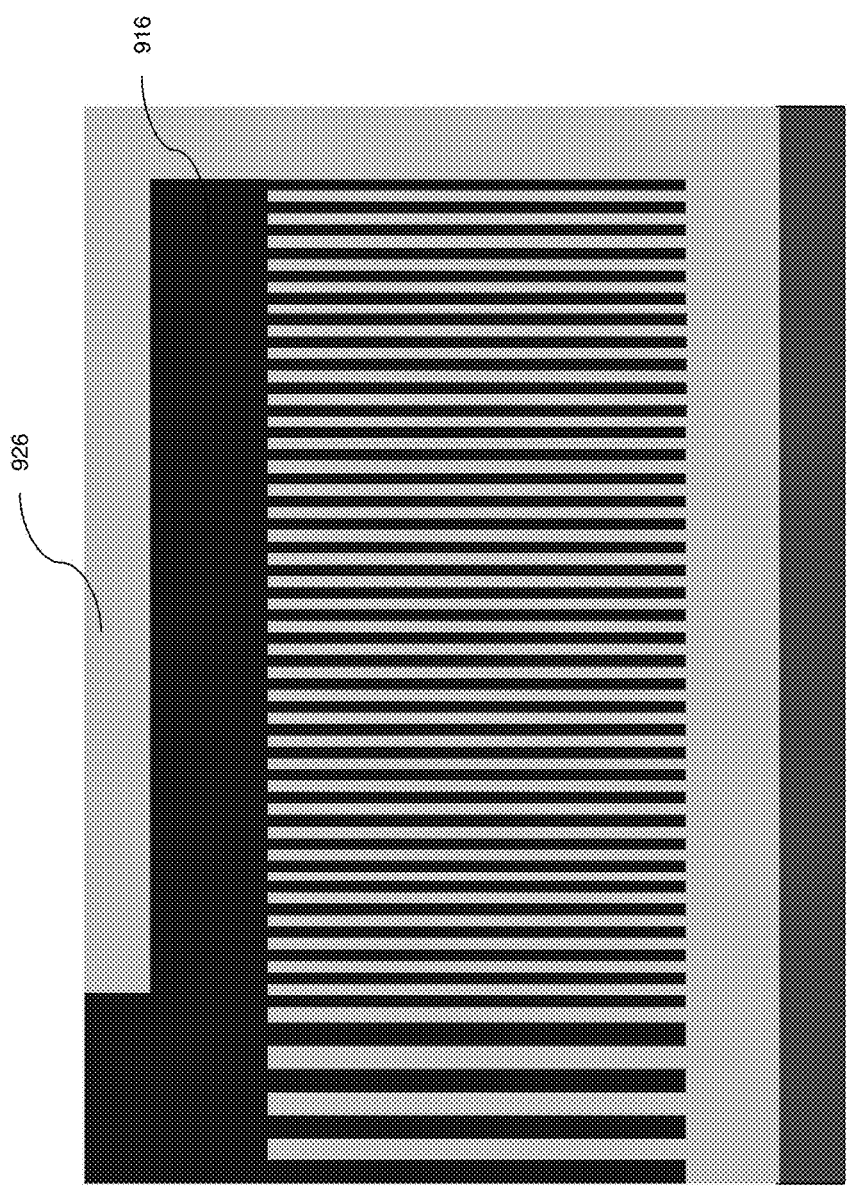
Figure 9U:
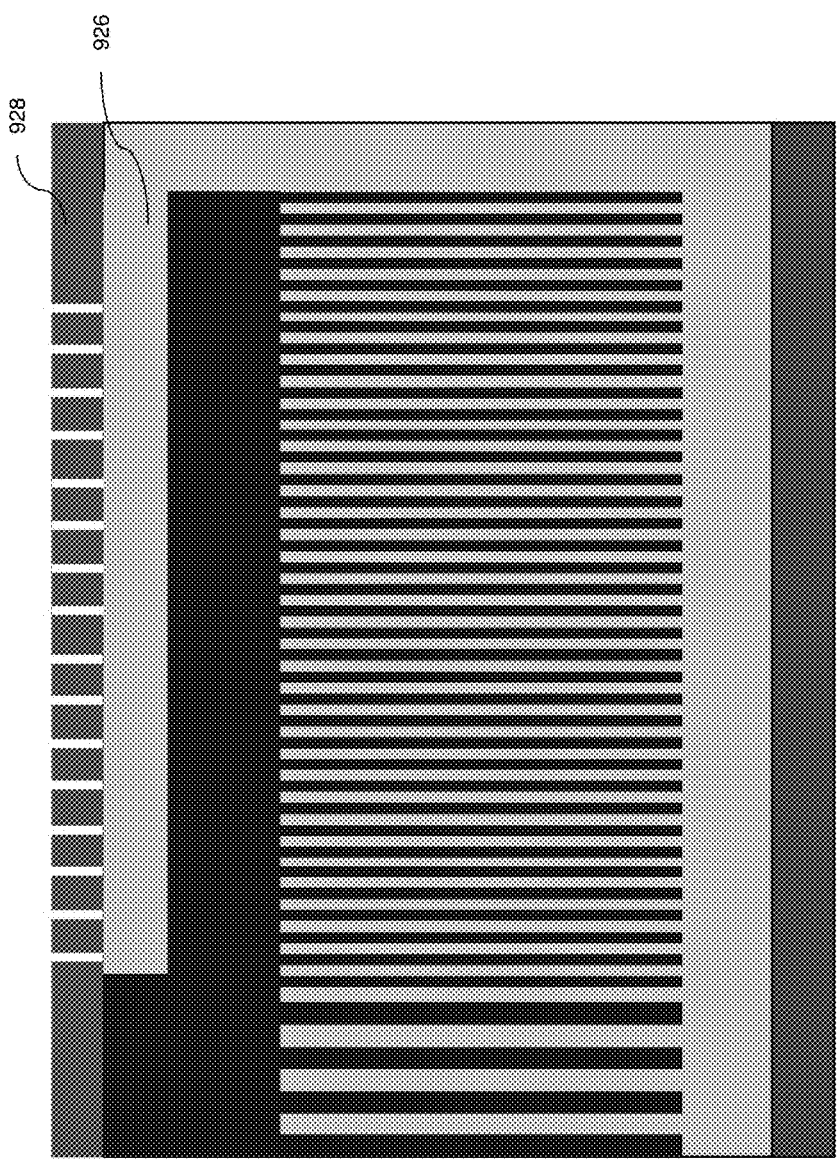
Figure 9V:
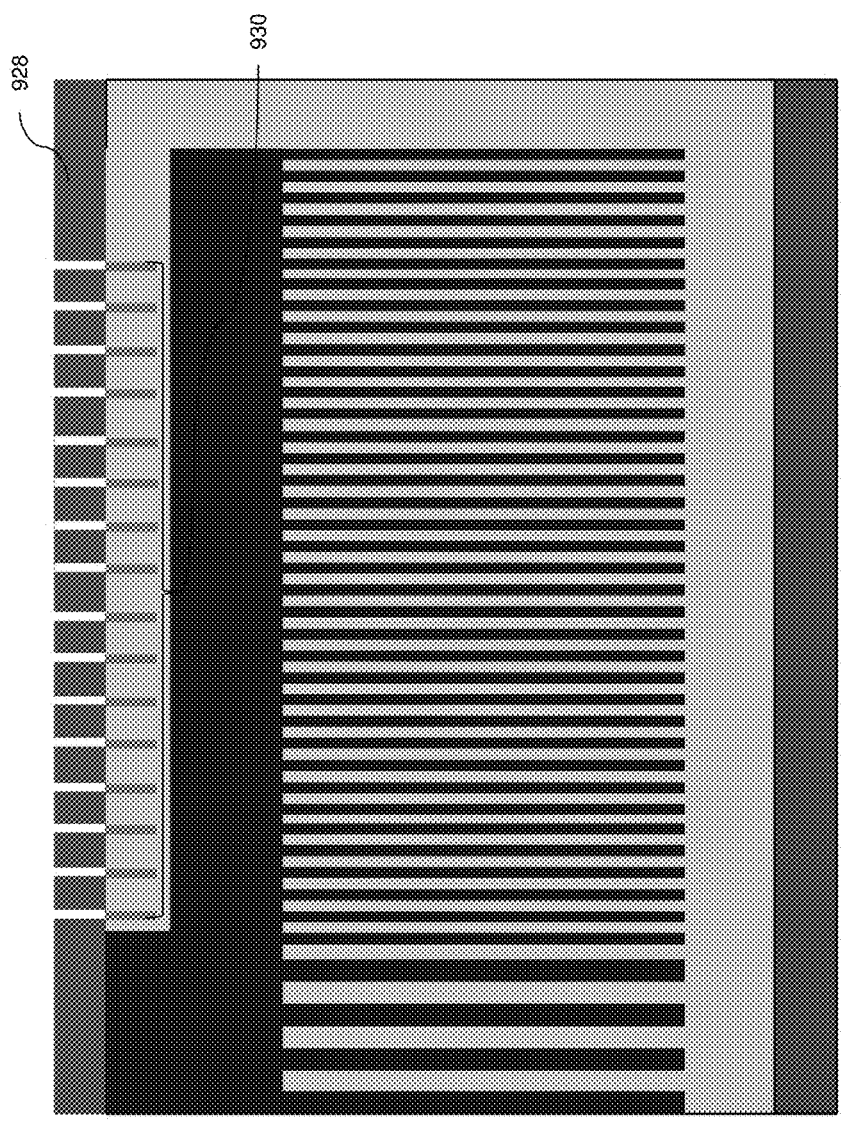
Figure 9W:
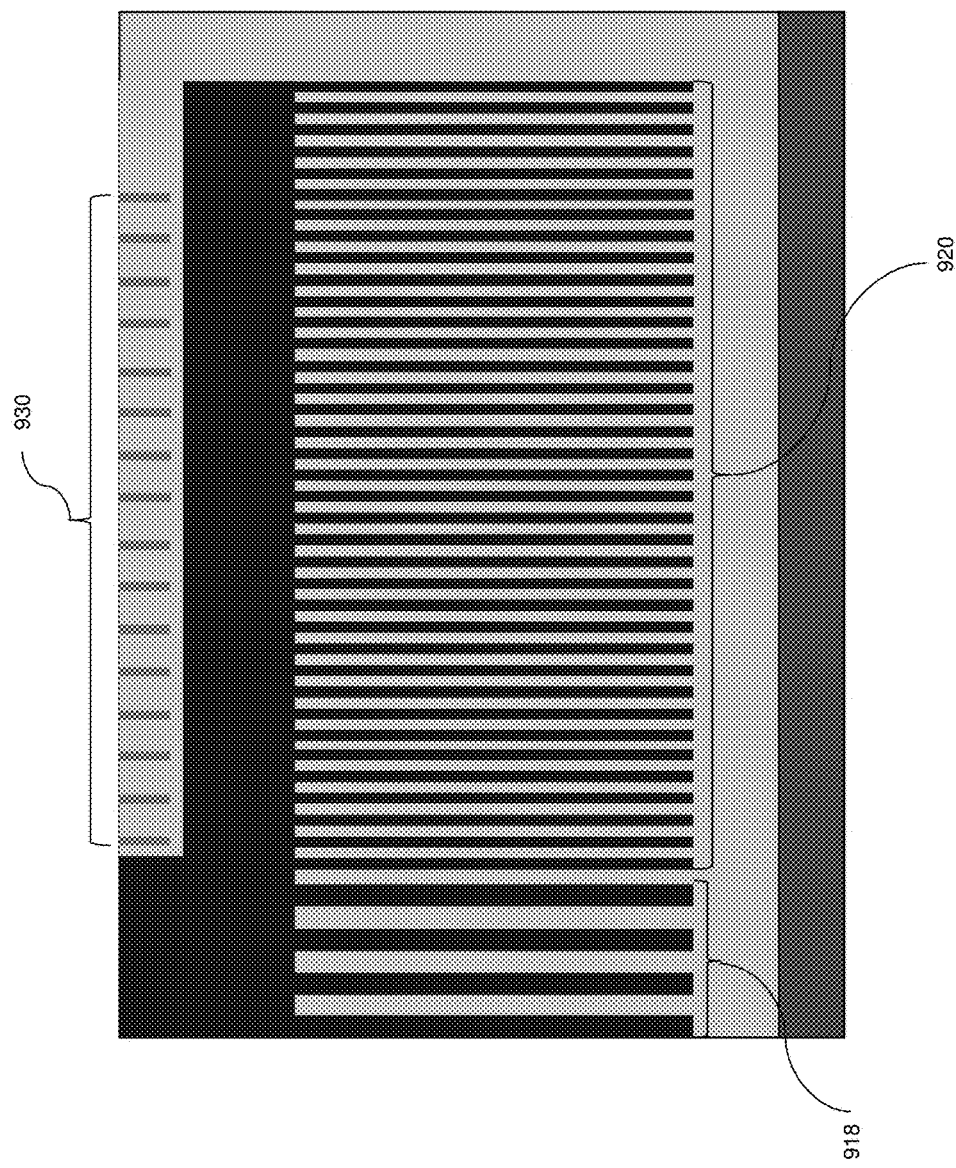
Figure 9X:
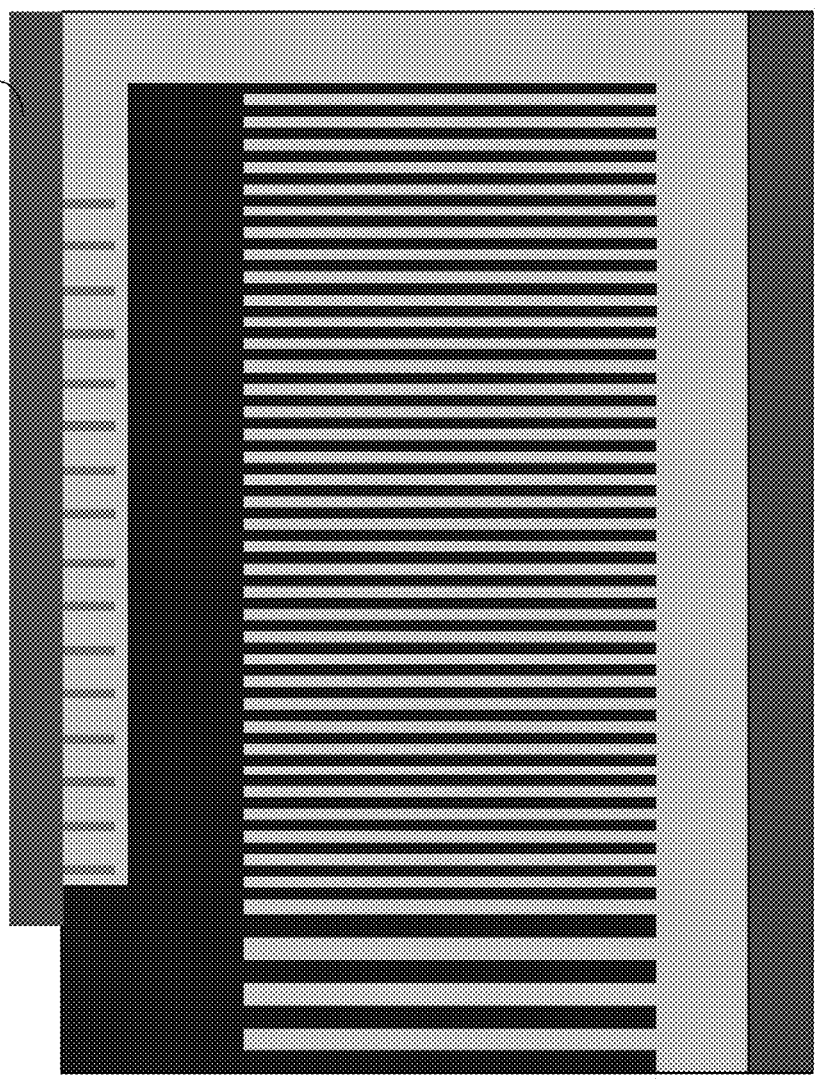
Figure 9Y:
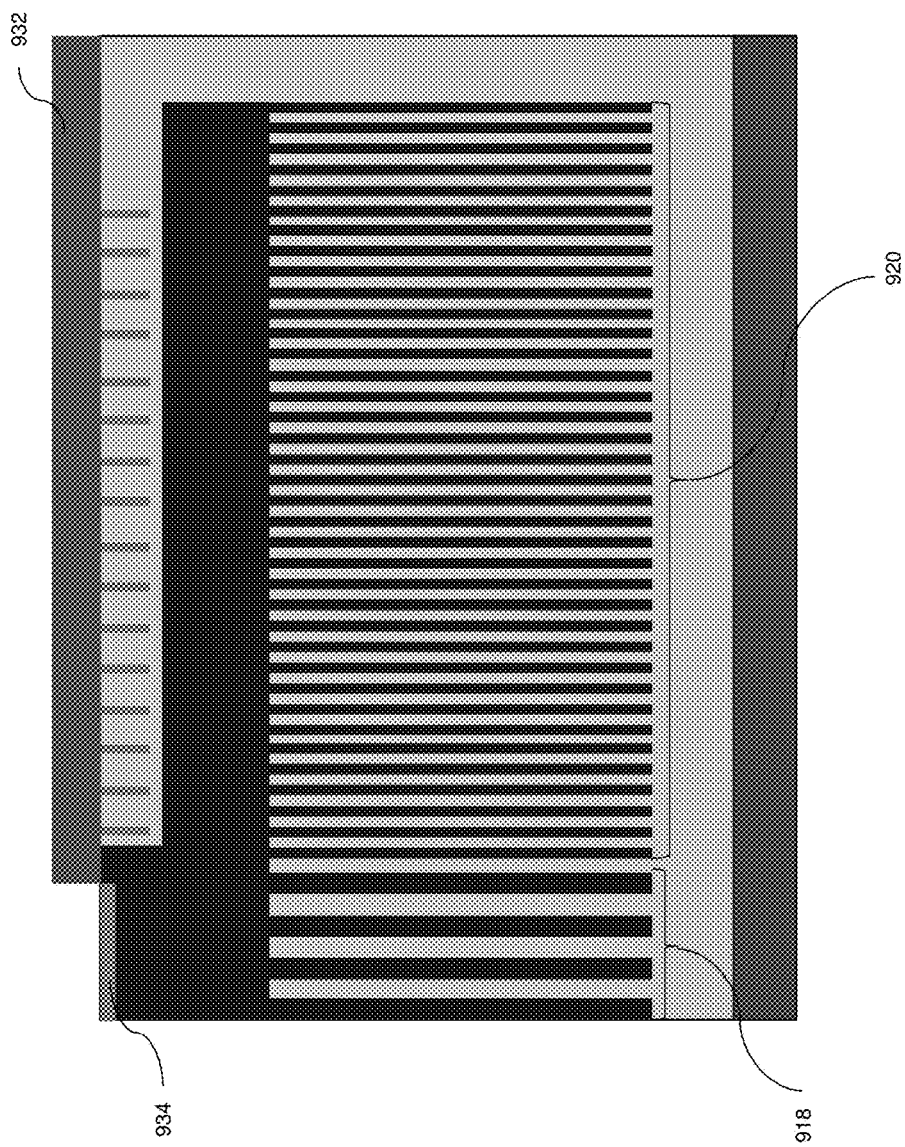
Figure 9Z:
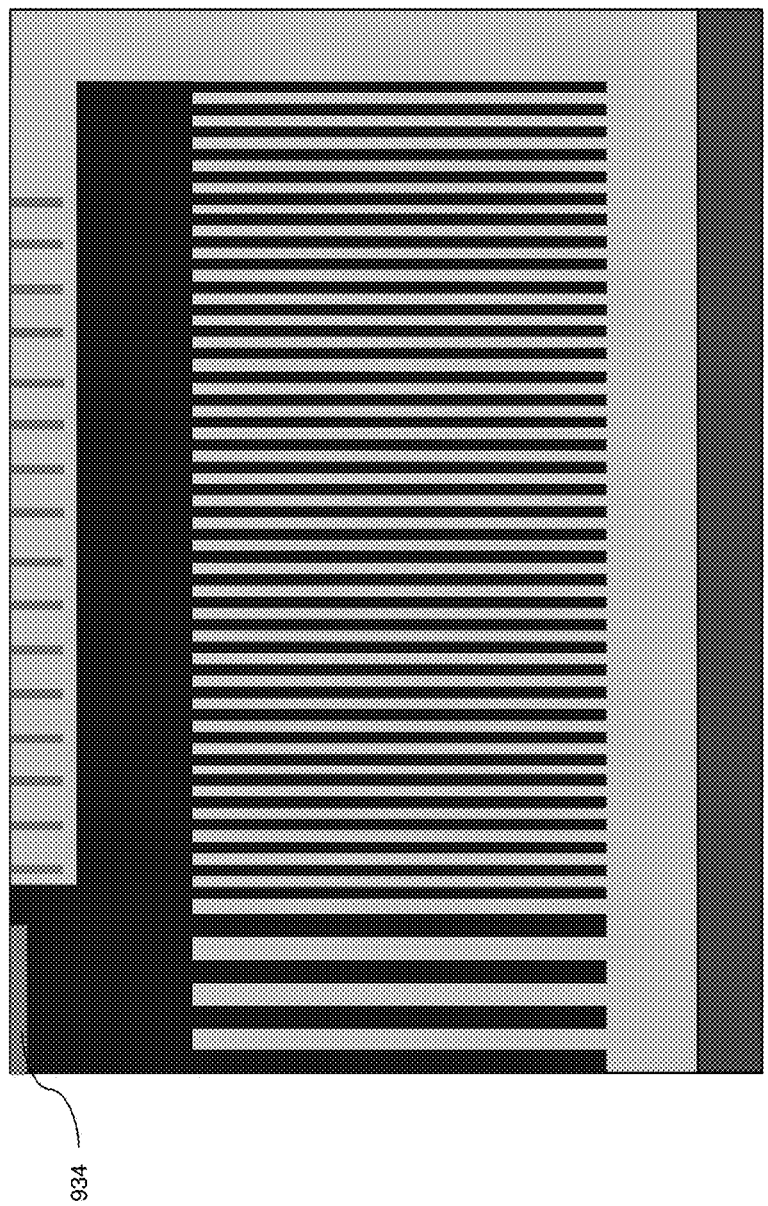
Figure 9A:
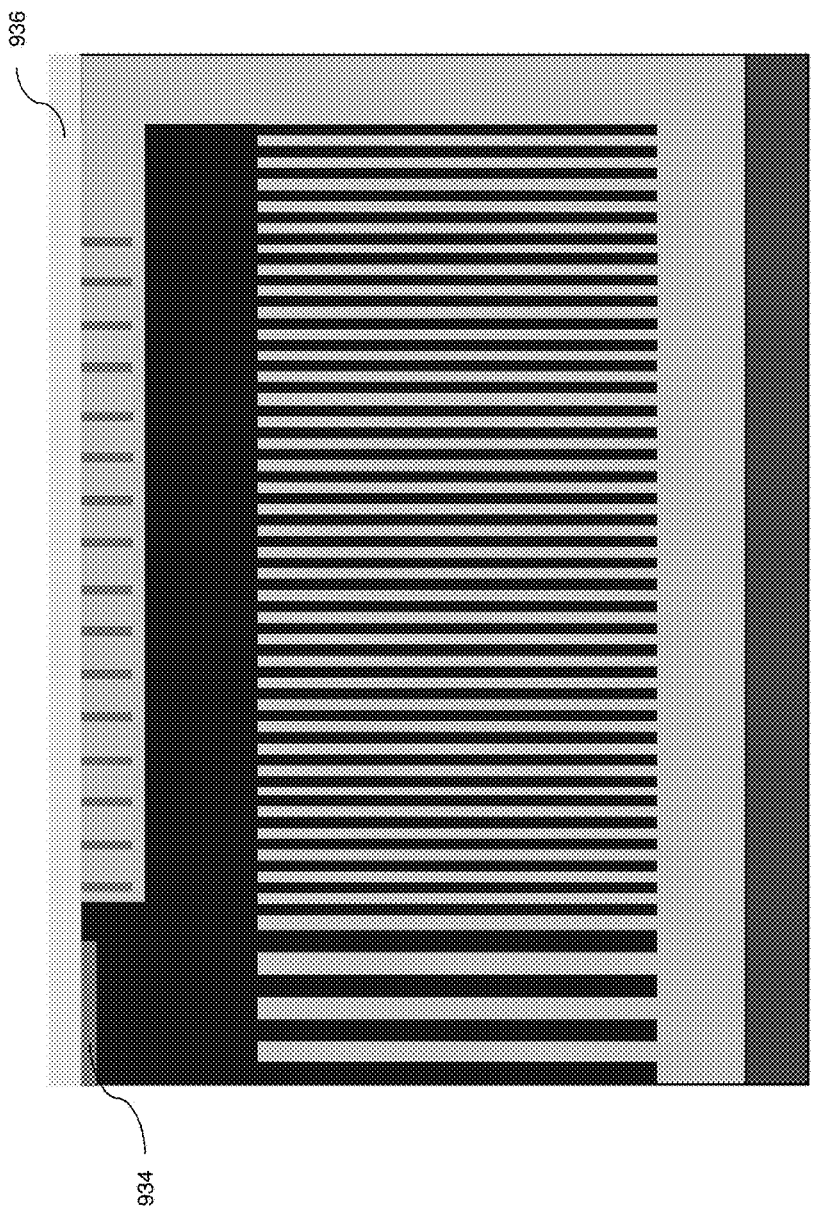
Figure 9B:
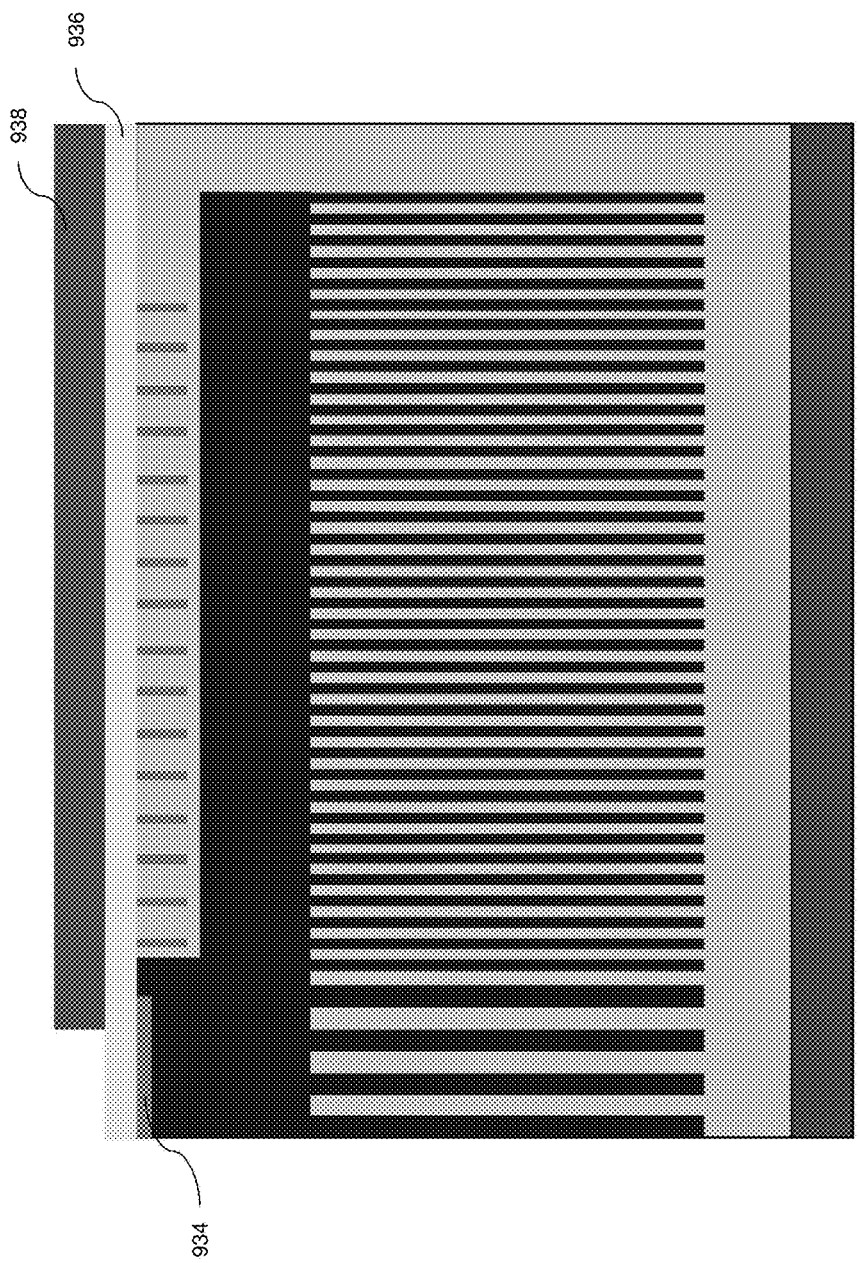
Figure 9C:
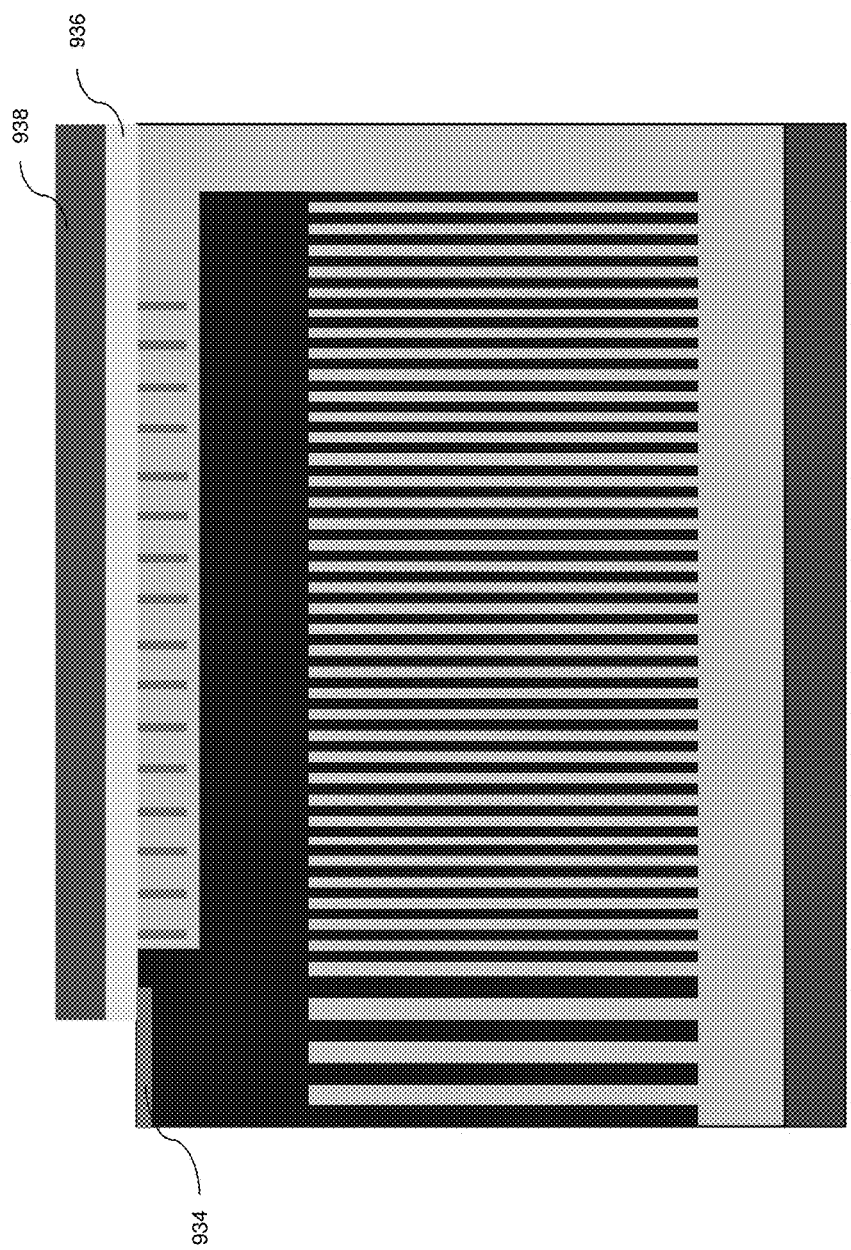

In operation 808, a first photoresist pattern 906 is formed on a top surface of first N layer 904 as illustrated in FIG. 9C.

Figure 9D:
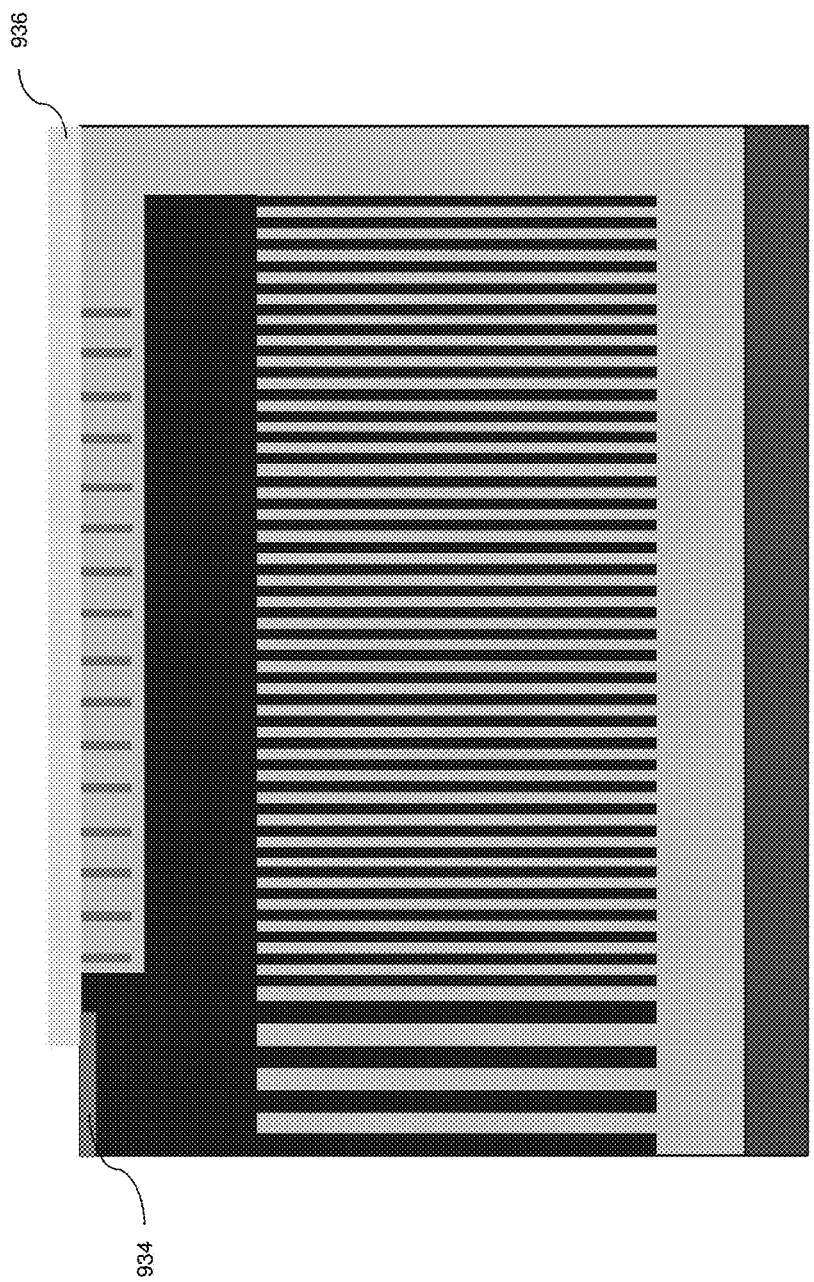
Figure 9E:
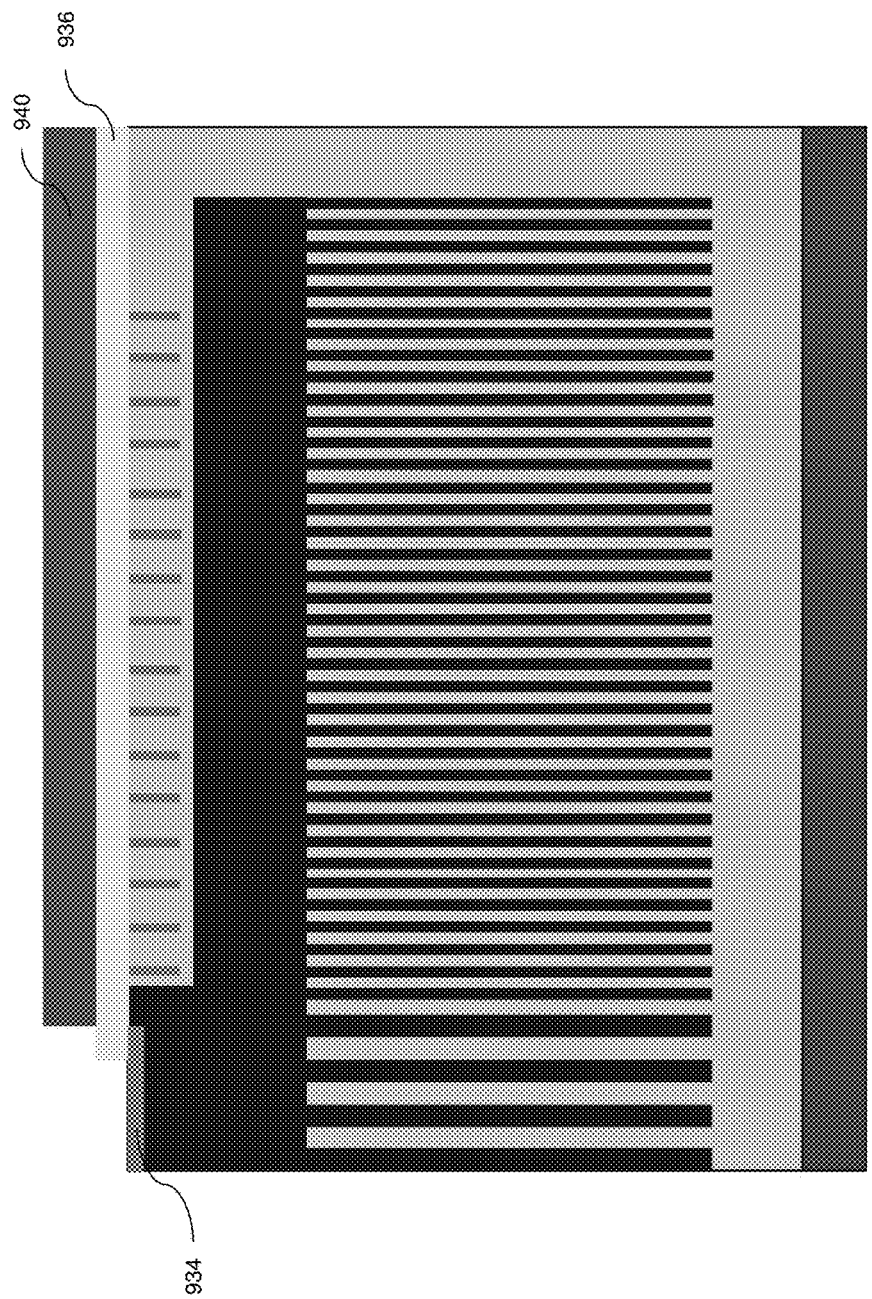
Figure 9F:
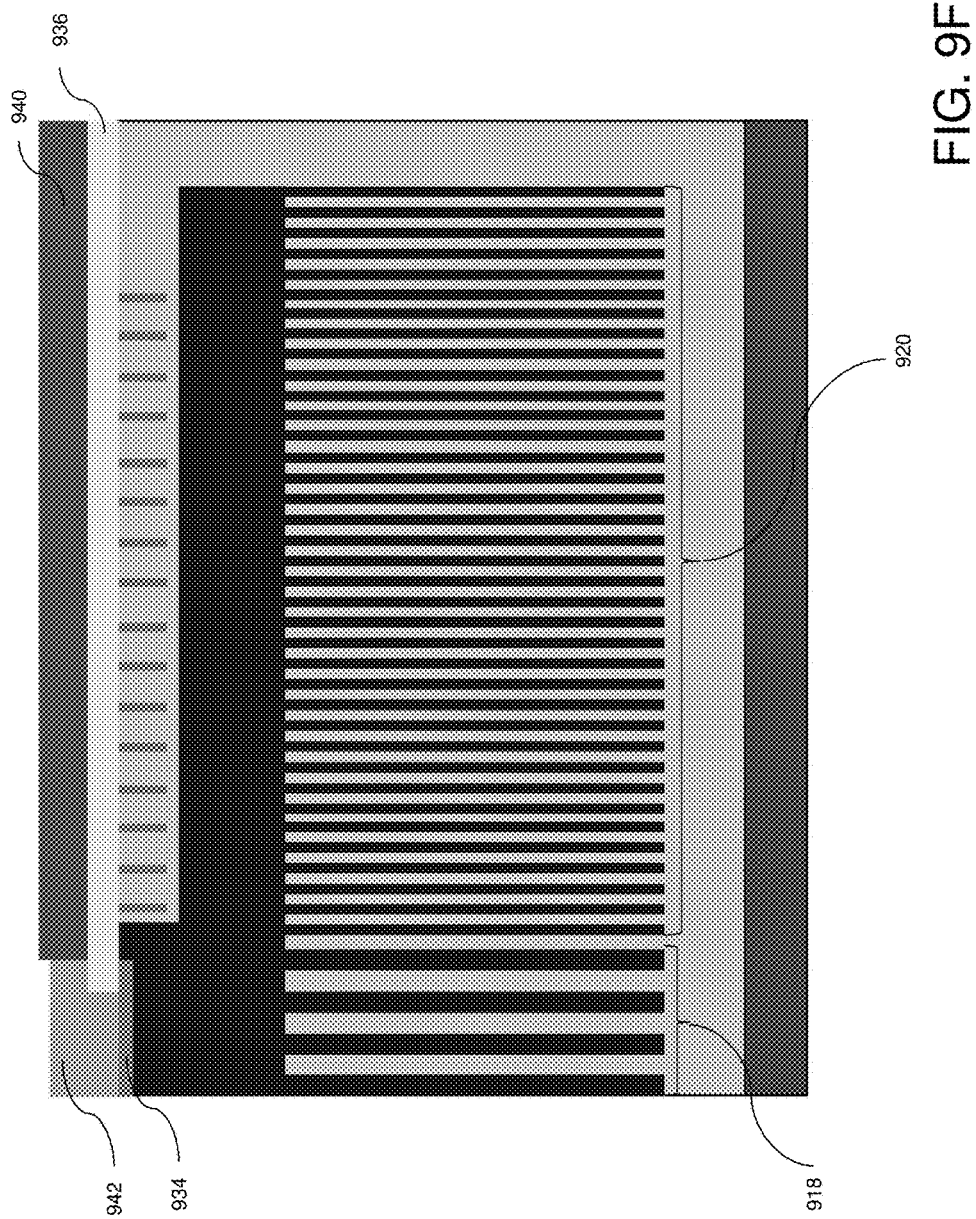
Figure 9G:
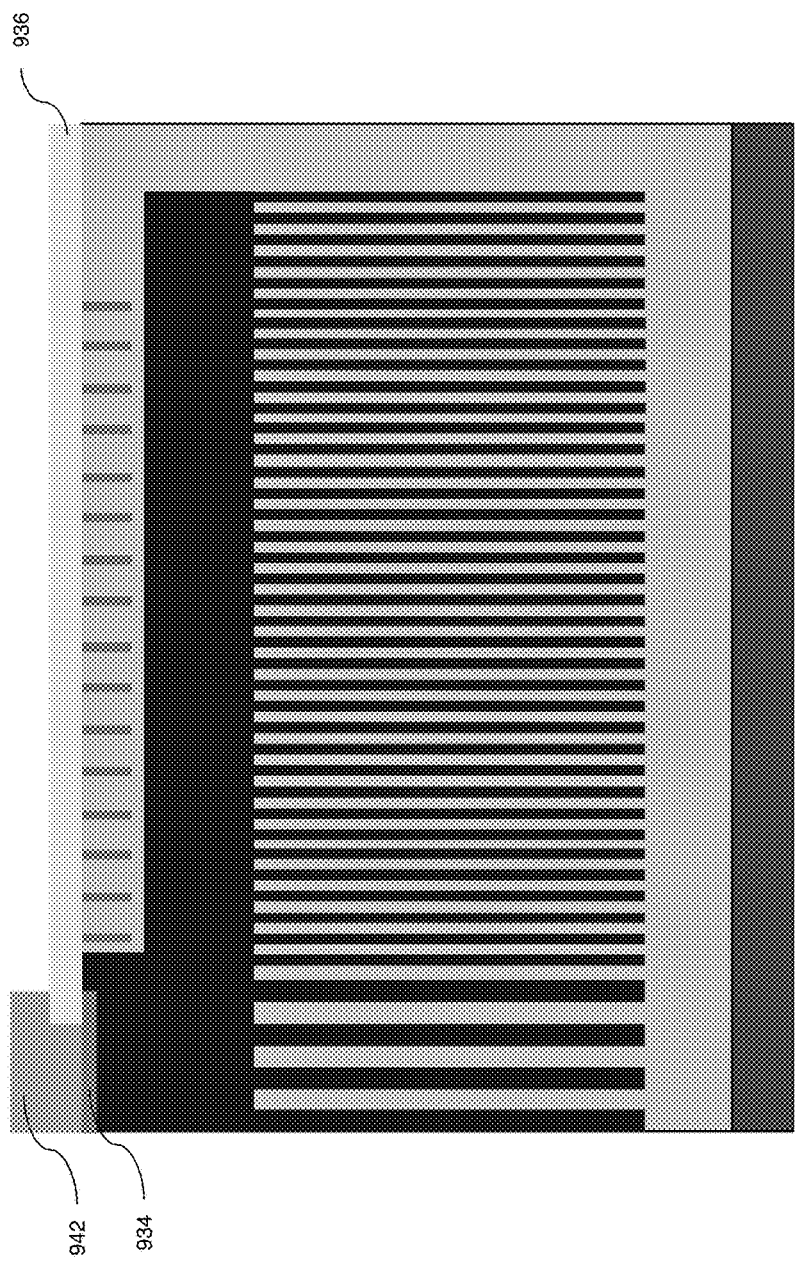
Figure 9H:
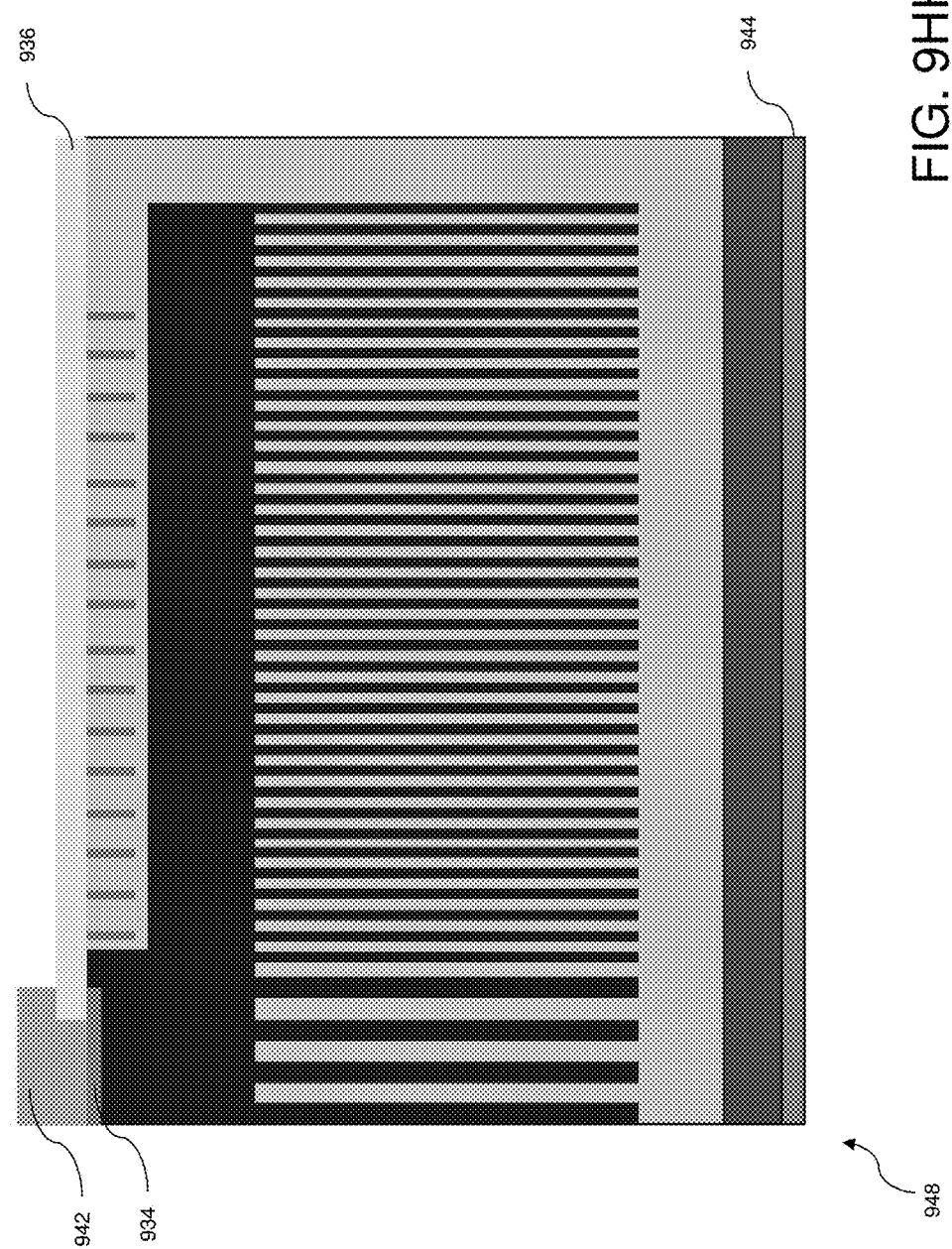

In operation 810, a first nickel layer 908 is electroplated on the top surface of first N layer 904 as illustrated in FIG. 9D.

In operation 812, first photoresist pattern 906 is removed leaving a first nickel mask formed of first nickel layer 908 over first N layer 904 as illustrated in FIG. 9E.

In operation 814, a plurality of trenches is etched in first N layer 904 in what will become an N drift region as illustrated in FIG. 9F. In one embodiment, the plurality of trenches includes a plurality of superjunction region trenches 910 and a plurality of edge termination region trenches 912. In one embodiment, superjunction region trenches 910 and edge termination region trenches 912 are etched to a depth of 28 µm in first N layer 904.

In one embodiment, a central first superjunction region trench 910 is formed having a first width, x, and second, third and fourth superjunction region trenches 910 are formed each having a second width equal to $x\sqrt{2}$. For example, a first superjunction region trench 910 may be formed having a width of 3.5 µm, and second, third and fourth superjunction region trenches 910 may be formed each having widths of approximately 5.0 µm (3.5 µm $\sqrt{2}$). Superjunction region trenches 910 are evenly spaced apart and separated by first regions of first N layer 904, i.e., N superjunction regions, each having the same width as the second width.

In one embodiment, each edge termination region trench 912 is formed having a third width equal to one-half the second width, i.e., $$\frac{x\sqrt{2}}{2}.$$

For example, where each second, third, and fourth superjunction region trenches 910 has a second width of 5.0 µm, each edge termination region trench 912 has a third width of approximately $$2.5 \text{ µm} \left(\frac{5 \text{ µm}}{2}\right).$$

Edge termination region trenches 912 are evenly spaced apart and separated by second regions of first N layer 904, i.e., N edge termination regions, each having the same width as an edge termination region trench 912. In one embodiment, the N edge termination region in first N layer 904 after the last superjunction region trench 912 and before the first edge termination region trench 914 is reduced from approximately 5.0 µm, to approximately 3.7 µm in order to maintain charge balance.

In operation 816, a second photoresist pattern 914 is formed over a portion of first nickel layer 908 as illustrated in FIG. 9G.

In operation 818, the exposed portions of first nickel layer 908 are removed in the N drift region as illustrated in FIG. 9H.

In operation 820, second photoresist pattern 914 is removed as illustrated in FIG. 9I.

In operation 822, the exposed top portions of first N layer 904 in the N drift region are further etched another 5 µm resulting in superjunction region trenches 910 and edge termination region trenches 912 of 28 µm in depth as illustrated in FIG. 9J.

Figure 8B:
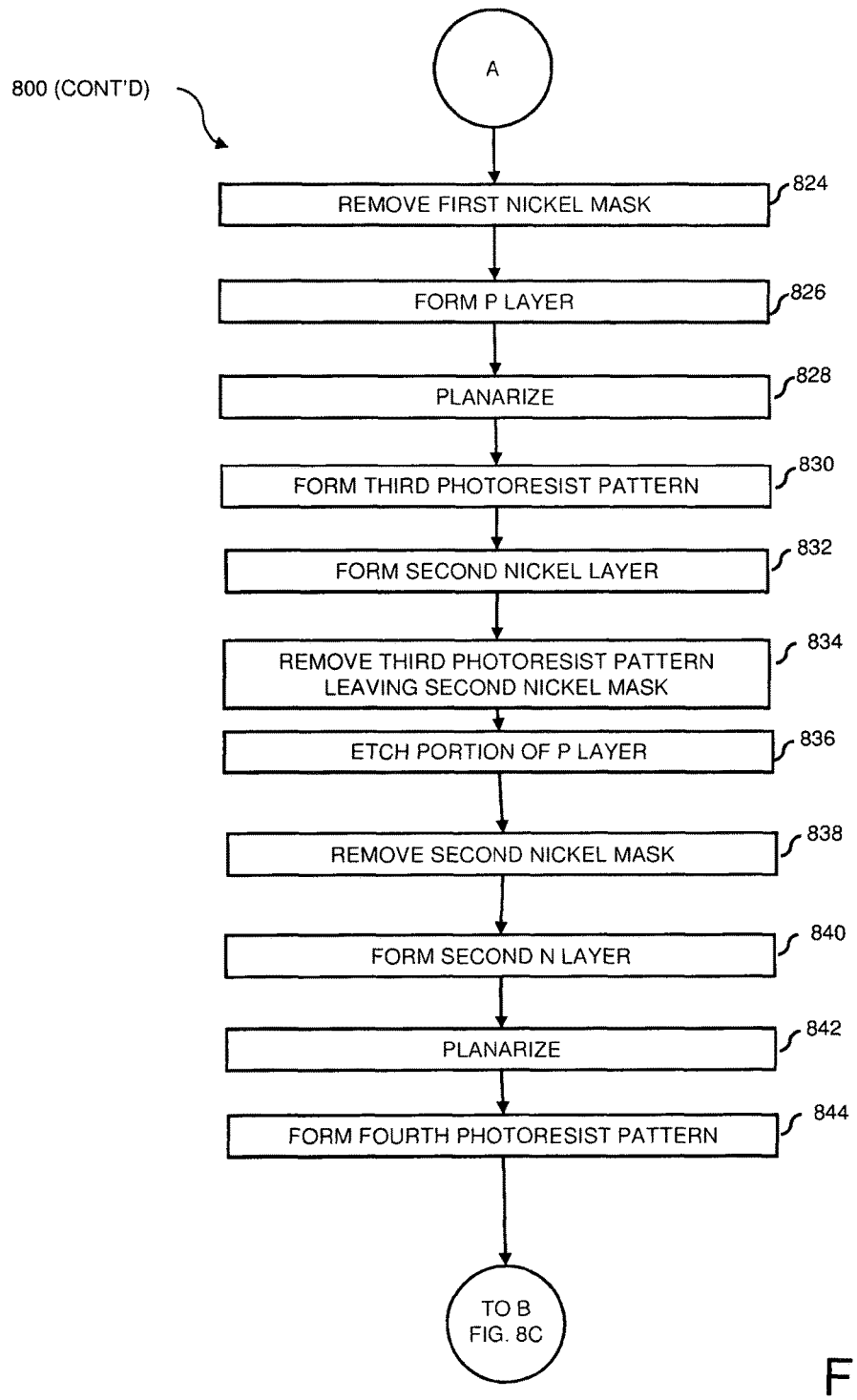

Refer now to FIG. 8B, in operation 824, the remaining portions of first nickel layer 908 are removed as illustrated in FIG. 9K.

In operation 826, a P layer 916 is formed over first N layer 904 filling trenches 910, 912 as illustrated in FIG. 9L. In one embodiment, P layer 916 is grown to a depth of 15 µm over first N layer 904. In one embodiment, P layer 916 is a 15 µm 2E16 P-type SiC layer formed by epitaxial regrowth. The filling of superjunction region trenches 910 and edge termination region trenches 912 results in the respective formation of a plurality of P superjunction regions 918 and a plurality of P edge termination regions 920. P layer 916 can be formed by epitaxial growth, or using other selected methods well-known to those of skill in the art.

In operation 828, P layer 916 is planarized, resulting in a surface where first N layer 904 is exposed next to P layer 916, as illustrated in FIG. 9M and forming a P well, or P drift region, of depth 5 µm.

In operation 830, a third photoresist layer 922 is formed over a portion of first N layer 904 that will become an edge termination area as illustrated in FIG. 9N.

In operation 832, a second nickel layer 924 is electroplated on the exposed surfaces as illustrated in FIG. 9O.

In operation 834, third photoresist layer 922 is removed leaving a second nickel mask formed of second nickel layer 924 as illustrated in FIG. 9P.

In operation 836, the exposed portion of P layer 916 is etched 2.5 μm resulting in P layer 916 being 5 μm in thickness over P superjunction regions 918 and 2.5 μm in thickness over P edge termination regions 920 as illustrated in FIG. 9Q.

In operation 838, second nickel mask 924 is removed as illustrated in FIG. 9R.

In operation 840, a second N layer 926 is formed as illustrated in FIG. 9S. In one embodiment, second N layer 926 is a 2E16 N-type SiC layer of at least 2.5 μm in depth. Second N layer 926 can be formed by epitaxial growth, or using other selected methods well-known to those of skill in the art.

In operation 842, second N layer 926 is planarized forming an N well having a depth of 2.5 μm as illustrated in FIG. 9T.

In operation 844, a fourth photoresist pattern 928 is formed on the surface as illustrated in FIG. 9U.

Figure 8C:
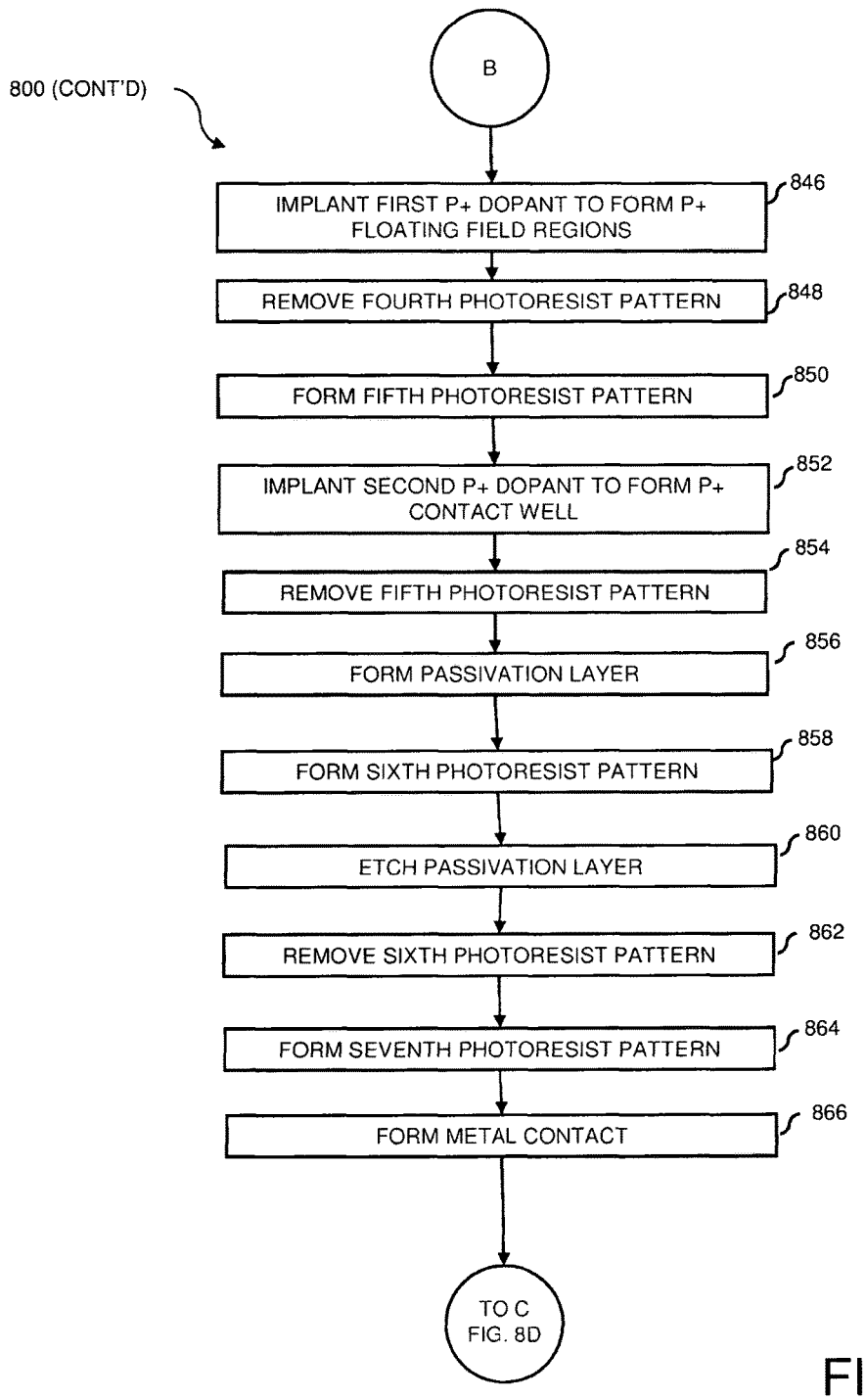

Refer now to FIG. 8C, in operation 846, a first P+ dopant is implanted in portions of second N layer 926 to form P+ floating field regions 930 as illustrated in FIG. 9V. Implantation of dopants, for example, such as by ion implantation, is well known in the art and not further described herein. In one embodiment, P+ floating field regions 930 are formed using a 1E18 P+ type SiC dopant and each has a depth of 1.9 μm. In one embodiment, each P+ floating field region 930 is formed having a fourth width of 2.5 μm.

In operation 848, fourth photoresist pattern 928 is removed as illustrated in FIG. 9W.

In operation 850, a fifth photoresist pattern 932 is formed on the surface as illustrated in FIG. 9X.

In operation 852, a second P+ dopant is implanted to form a P+ contact well 934 as illustrated in FIG. 9Y. In one embodiment, P+ contact well 934 is formed using a 1E18 P+ type SiC dopant, and P+ contact well has depth of 0.6 μm. In one embodiment, P+ contact well 934 is formed such that it is vertically positioned over 3 P superjunction regions 918 and terminates over a fourth P superjunction region 918.

In operation 854, fifth photoresist pattern 932 is removed as illustrated in FIG. 9Z.

In operation 856, an oxide/passivation layer 936 is deposited as illustrated in FIG. 9AA. The formation of oxide/passivation layers formation is well-known to those of skill in the art and not further detailed herein.

In operation 858, a sixth photoresist pattern 938 is formed on the surface as illustrated in FIG. 9BB.

In operation 860, the exposed portion of oxide/passivation layer 946 is etched, exposing a portion of P+ contact well 934 as illustrated in FIG. 9CC.

In operation 862, sixth photoresist pattern 938 is removed as illustrated in FIG. 9DD.

In operation 864, a seventh photoresist pattern 940 is formed on the surface in preparation for forming a metal contact as illustrated in FIG. 9EE.

In operation 866, a metal or metal alloy is deposited to form a metal contact 942 over a portion of P+ contact well 934 as illustrated in FIG. 9FF. In one embodiment, the metal alloy is a 0.1 μm Ni/0.5 μm Al alloy, where Ni represents nickel and Al represents aluminum.

Figure 8D:
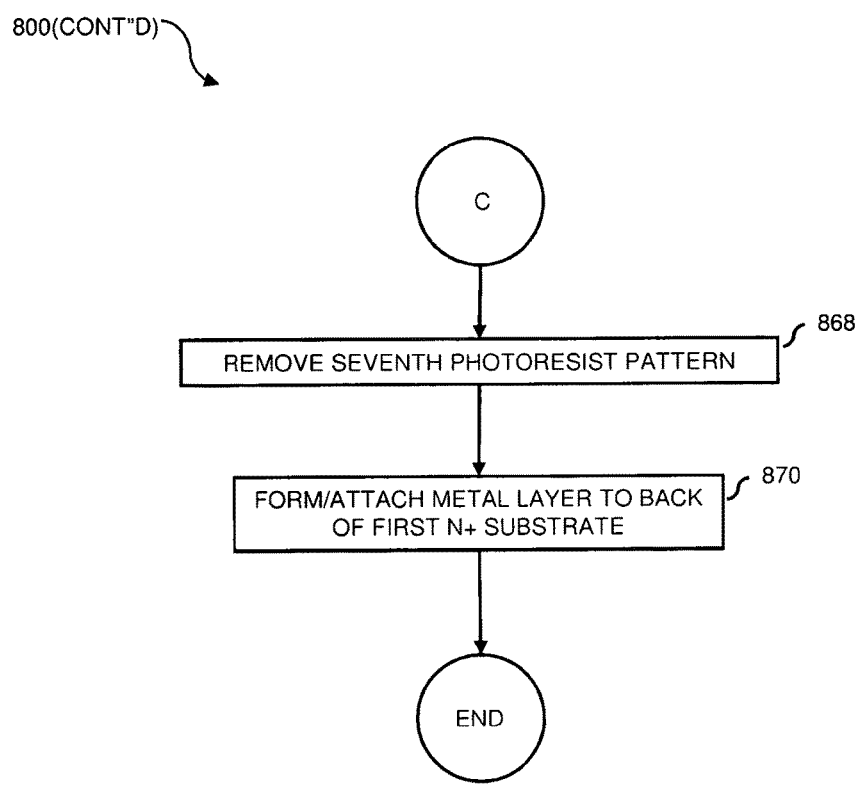

Referring now to FIG. 8D, in operation 868, seventh photoresist pattern 940 is removed as illustrated in FIG. 9GG.

In operation 870, a conductive metal layer 944 is formed on or attached to the back surface of N+ layer 902 to form an ohmic contact with N+ layer 902 as illustrated in FIG. 9HH. Metal layer 944 serves as the cathode terminal to the anode terminal, i.e., metal contact 942, in the vertical conduction structure of the resultant semiconductor device with vertical superjunction edge termination structure 948. Metal layer 944 may be suitable for soldering or assembly requirements. Thus, although not shown in FIG. 1, this metal layer can be formed on the back surface of N+ layer 102 (FIG. 1).

This disclosure provides exemplary embodiments of the present invention. The scope of the present invention is not limited by these exemplary embodiments. Numerous variations, whether explicitly provided for by the specification or implied by the specification or not, may be implemented by one of skill in the art in view of this disclosure. Although embodiments of the present invention are discussed with respect to silicon carbide semiconductor devices, the embodiments are not intended to be exhaustive or to limit the invention to the precise forms disclosed. In various applications, fewer or more P superjunction regions, P edge termination regions, and P+ floating field regions may be utilized. As can be appreciated by those of skill in the art, a variety of manufacturing methods may be used to form the structures described herein, and those of ordinary skill in the art may make various modifications and variations in light of the disclosure.

What is claimed is:

1. An annular semiconductor device having a vertical superjunction edge termination structure for a drift region comprising:
    an N+ type substrate layer having a top surface and a back surface;
    an N type layer located above said top surface of said N+ substrate layer;
    a plurality of P type superjunction regions located in said N type layer;
    a plurality of P type edge termination regions located in said N type layer adjacent to said plurality of P type superjunction regions;
    a P type well located above said plurality of P type superjunction regions and said plurality of P type edge termination regions;
    a P+ type contact well located in said P type well, said P+ type contact well having a depth D1 and extending horizontally over at least a portion of said plurality of P type superjunction regions;
    an anode contact located above and in contact with said P+ type contact well;
    an N type well located in said P type well, said N type well having a depth D2 and extending horizontally over said plurality of P type edge termination regions;
    a plurality of P+ type floating field regions located in said N type well, each of said plurality of P+ floating field regions having a depth D3;
    a passivation layer located over at least a portion of a top surface of said N type well and said P type well; and
    a conductive metal contact layer located and in contact with said back surface of said N+ type substrate layer.

2. The annular semiconductor device of claim 1 wherein said P+ type contact well extends horizontally over a first P type superjunction region, a second P type superjunction region, a third P type superjunction region, and a portion of a fourth P type superjunction region of said plurality of P type superjunction regions.

3. The annular semiconductor device of claim 2 further comprising wherein an outer edge of said P+ contact well region terminates at or near a centerline of said fourth P superjunction region.

4. The annular semiconductor device of claim 3 wherein said anode contact extends horizontally over said first P type superjunction region, said second P type superjunction region, and said portion of a third P type superjunction region.

5. The annular semiconductor device of claim 4 wherein an outer edge of said anode contact terminates at or near a centerline of said third P type superjunction region.

6. The annular semiconductor device of claim 1 wherein said depth D2 of said N type well is four times said depth D1 of said P+ type contact well.

7. The annular semiconductor device of claim 6 wherein said depth D3 of each of said P+ floating field regions is three times said depth D1 of said P+ type contact well.

8. The annular semiconductor device of claim 7 wherein a portion of said P type well located above said plurality of P type edge termination regions and below said N type well has a depth D4 that is equal to said depth D2 of said N type well.

9. The annular semiconductor device of claim 5 wherein each of said plurality of P+ type floating field regions is located over every other P type edge termination region.

10. The annular semiconductor device of claim 2 wherein said first P superjunction region has a first width, x,
    wherein each of said second, third and fourth P superjunction regions has a second width equal to $x\sqrt{2}$, and
    wherein each of said plurality of edge termination regions has a third width equal to $$\frac{x\sqrt{2}}{2}.$$

11. The annular semiconductor device of claim 1 wherein said N+ type substrate layer is formed of 1E18 N type SiC 4° (degree) off-axis;
    wherein said N type layer is formed of 2E16 N type;
    wherein each of said plurality of P type superjunction regions is formed of 2E16 P type SiC;
    wherein each of said plurality of P type edge termination regions is formed of 2E16 P type SiC;
    wherein said P type well is formed of 2E16 P type SiC;
    wherein said P+ type contact well is formed of 1E18 P type SiC;
    wherein said anode contact is formed of 0.1 μm Ni/0.5 μm Al alloy;
    wherein said N type well is formed of 2E16 N type SiC; and
    wherein each of said plurality of P+ type floating field regions is formed of 1E18 P type SiC.

12. A method for forming an annular semiconductor device having a vertical superjunction edge termination structure for a drift region comprising:
    obtaining an N+ type substrate, said N+ type substrate having a top surface and a back surface;
    forming a first N type layer over said top surface of said N+ type substrate;
    forming a plurality of superjunction region trenches and a plurality of edge termination region trenches in said first N type layer;
    etching a portion of said first N type layer to form a first well region;
    forming a P type layer over said first N type layer, said P type layer filling said plurality of superjunction region trenches to form P type superjunction regions, filling said plurality of edge termination region trenches to form P type edge termination regions, and filling said first well region to form a P well region;
    planarizing the surface of said P type layer and a remaining unetched portion of said first N type layer;
    etching said P type layer and a portion of said remaining unetched portion of said first N type layer to form a second well region;
    forming a second N type layer, said second N type layer filling said second well region to form an N type well;
    implanting a plurality of P+ type floating field regions in said N type well;
    implanting a P+ type contact well in a portion of said P type layer;
    forming an anode contact over a portion of said P+ type contact well;
    forming a passivation layer over a top surface of said semiconductor device excepting said anode contact; and
    forming a conductive metal layer on said back surface of said N+ type substrate.

13. The method of claim 12 wherein said P+ type contact well extends horizontally over a first P type superjunction region, a second P type superjunction region, a third P type superjunction region, and a portion of a fourth P type superjunction region of said plurality of P type superjunction regions.

14. The method of claim 13 further comprising wherein an outer edge of said P+ contact well region terminates at or near a centerline of said fourth P superjunction region.

15. The method of claim 14 wherein said anode contact extends horizontally over said first P type superjunction region, said second P type superjunction region, and a portion of said third P type superjunction region.

16. The method of claim 15 wherein an outer edge of said anode contact terminates at or near a centerline of said third P type superjunction region.

17. The method of claim 12 wherein said N type well has a depth D2 that is four times a depth D1 of said P+ type contact well.

18. The method of claim 17 wherein each of said P+ floating field regions has a depth D3 that is three times said depth D1 of said P+ type contact well.

19. The method of claim 18 wherein a portion of said P type well located above said plurality of P type edge termination regions and below said N type well has a depth D4 that is equal to said depth D2 of said N type well.

20. The method of claim 13 wherein said first P superjunction region has a first width, x,
    wherein each of said second, third and fourth P superjunction regions has a second width equal to $x\sqrt{2}$, and
    wherein each of said plurality of edge termination regions has a third width equal to $$\frac{x\sqrt{2}}{2}.$$

21. The method of claim 20 wherein each of said plurality of P+ type floating field regions has a fourth width and is located over every other P type edge termination region.

22. The method of claim 12 further comprising:
   wherein said N+ type substrate is formed of 1E18 N-type SiC 4° (degree) off-axis wafer;
   wherein said first N type layer is formed of 2E16 N-type SiC;
   wherein said P type layer is formed of 2E16 P-type SiC;
   wherein said second N type layer is formed of 2E16 N-type SiC;
   wherein each of said plurality of P+ floating field regions is formed of 1E18 P-type SiC;
   wherein said P+ type contact well is formed of 1E18 P-type SiC; and
   wherein said anode contact is formed of a 0.1 μm Ni/0.5 μm Al alloy.

\* \* \* \* \*